United States Patent [19]
Nakamura et al.

[11] Patent Number: 5,767,581
[45] Date of Patent: Jun. 16, 1998

[54] GALLIUM NITRIDE-BASED III-V GROUP COMPOUND SEMICONDUCTOR

[75] Inventors: Shuji Nakamura; Takao Yamada; Masayuki Senoh; Motokazu Yamada; Kanji Bando, all of Anan, Japan

[73] Assignee: Nichia Chemical Industries, Ltd., Japan

[21] Appl. No.: 670,242

[22] Filed: Jun. 17, 1996

Related U.S. Application Data

[62] Division of Ser. No. 234,001, Apr. 28, 1994, Pat. No. 5,563,422.

[30] Foreign Application Priority Data

| Apr. 28, 1993 | [JP] | Japan | 5-124890 |
| May 31, 1993 | [JP] | Japan | 5-129313 |
| Jul. 28, 1993 | [JP] | Japan | 5-207274 |
| Sep. 21, 1993 | [JP] | Japan | 5-234684 |
| Sep. 21, 1993 | [JP] | Japan | 5-234685 |
| Oct. 8, 1993 | [JP] | Japan | 5-253171 |
| Jan. 28, 1994 | [JP] | Japan | 6-8726 |
| Jan. 28, 1994 | [JP] | Japan | 6-8727 |

[51] Int. Cl.$^6$ .................................................. H01L 29/78
[52] U.S. Cl. .................. 257/749; 257/76; 257/79; 257/86; 257/615; 257/744; 257/764; 257/765; 257/766; 257/769; 257/431
[58] Field of Search .................... 257/13, 76, 79, 257/86, 431, 615, 744, 749, 764, 765, 766, 769

[56] References Cited

U.S. PATENT DOCUMENTS

| 4,153,905 | 5/1979 | Charmakadze et al. | 257/13 |
| 4,495,514 | 1/1985 | Lawrence et al. | 257/13 |
| 5,247,533 | 9/1993 | Okazaki et al. | 257/13 |
| 5,281,830 | 1/1994 | Kotaki et al. | 257/13 |
| 5,285,078 | 2/1994 | Mimura et al. | 257/13 |

FOREIGN PATENT DOCUMENTS

| 0 483 688 A2 | 5/1992 | European Pat. Off. |
| 0 483 688 A3 | 5/1992 | European Pat. Off. |

OTHER PUBLICATIONS

M.E. Lin et al. "Low resistance ohmic contacts on wide band-gap GaN" Appl. Phys. Lett. 64 (8) 21 Feb. 1994, pp. 1003-1005.

B. Goldenberg et al. "Ultraviolet and violet light-emitting ... " Appl. Phys. Letts. 62 (1993), 25 Jan. No. 4, New York, US, pp. 381-383.

J.S. Foresi et al. "Metal contacts to gallium nitride" Appl. Phys. Letts. 62(1993) 31 May, No. 22, New York, US, pp. 2859-2861.

I. Akasaki et al. "High efficiency UV ... " Proc. Of the SPIE; Phys. Concepts of Materials ... 28 Oct. 1990, Aachen, DE, pp. 138-149.

M. Asif Khan et al. "Metal semiconductor field effect ... " Appl. Phys. Letts. 62(15), 12 Apr. 1993, pp. 1786-1787.

S. Nakamura et al. "High-power InGan/Gan ... " Appl. Phys. Letts. 62(19), 10 May 1993, pp. 2390-2392.

H. Morkoc et al. "Large-band gap SIC....." J. Phys. 76(3), 1 Aug. 1994, pp. 1363-1398.

Patent Abstracts of Japan, vol. 18 No. 80 (E-1505) 9 Feb. 1994 & JP-A-05 291 621 (Nichia chem Ind Ltd) 5 Nov. 1993. See abstract.

Database WPI, Week 9444, Derwent Publications Ltd., London, GB, AN 94-352820 & JP A-6 275 868 (Nichia Kagaku Kogyo KK) 30 Sep. 1994, see abstract.

Database WPI, Week 9438, Derwent Publications Ltd., London, GB, AN 94-308360 & JP A-6 237 012 (Nichia Kagaku Kogyo KK) 23 Aug. 1994, see abstract.

Kahn et al. "Metal semiconductor field ... " Appl. Phys. Lett. 62(15), 12 Apr. 1993.

*Primary Examiner*—Edward Wojciechowicz
*Attorney, Agent, or Firm*—Nixon & Vanderhye

[57] ABSTRACT

A gallium nitride-based III-V Group compound semiconductor device has a gallium nitride-based III-V Group compound semiconductor layer provided over a substrate and an ohmic electrode provided in contact with the semiconductor layer. The ohmic electrode is formed of a metallic material, and has been annealed.

37 Claims, 10 Drawing Sheets

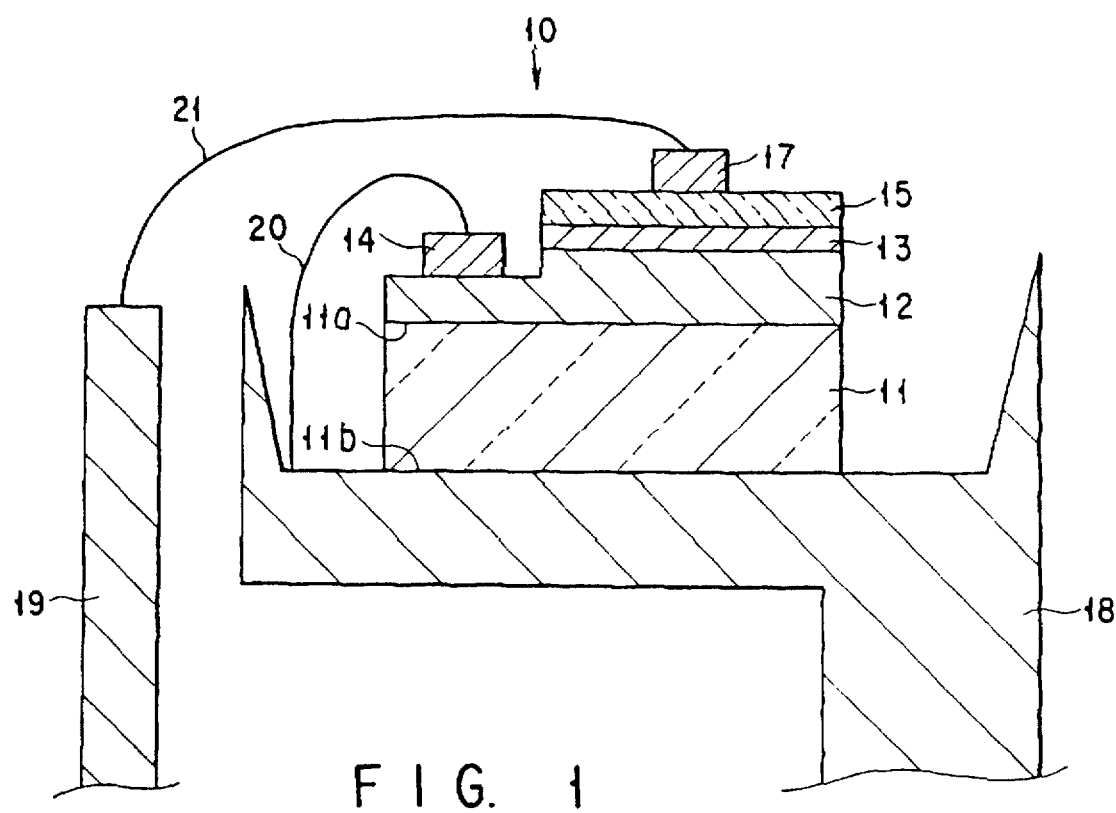
F I G. 1
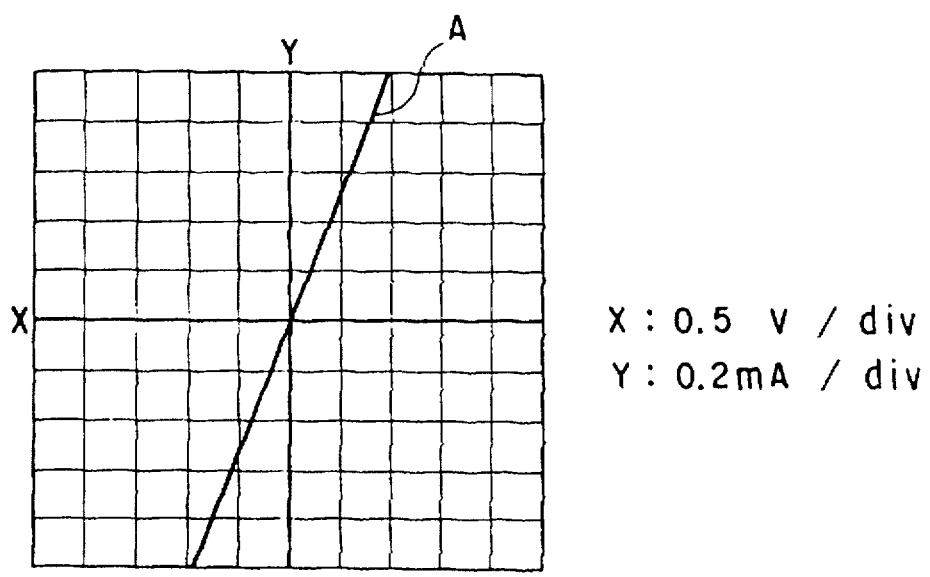
X : 0.5 V / div
Y : 0.2 mA / div
F I G. 2

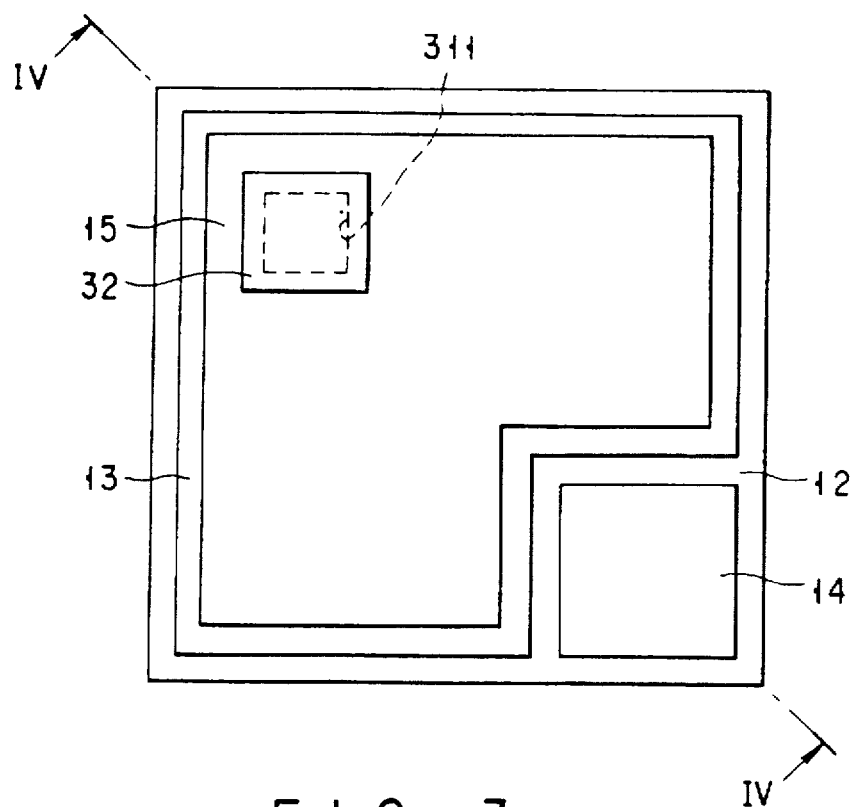
F I G. 3
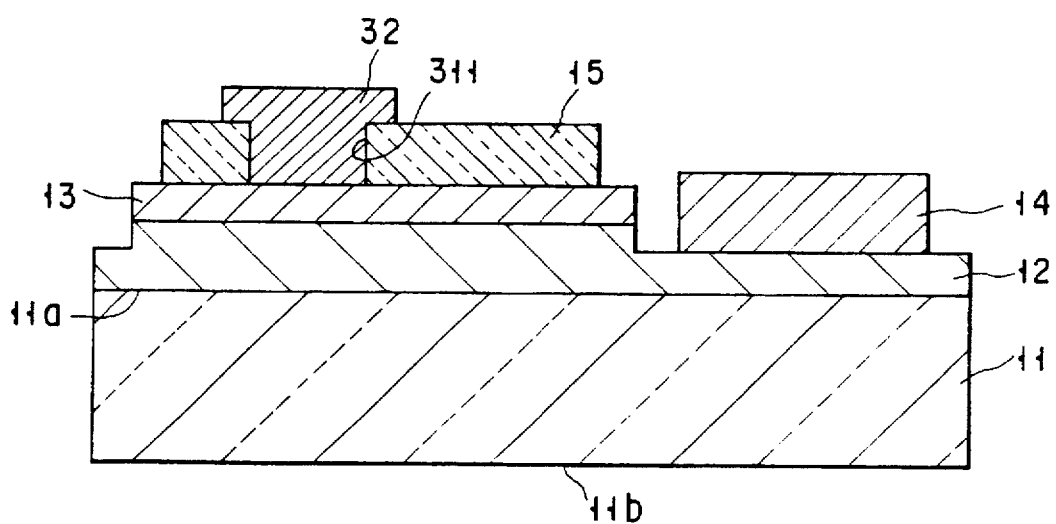
F I G. 4

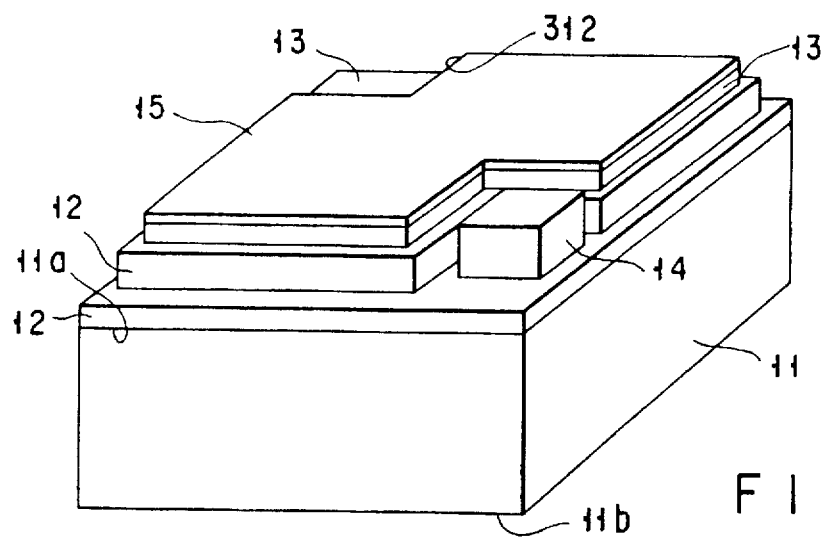
FIG. 5
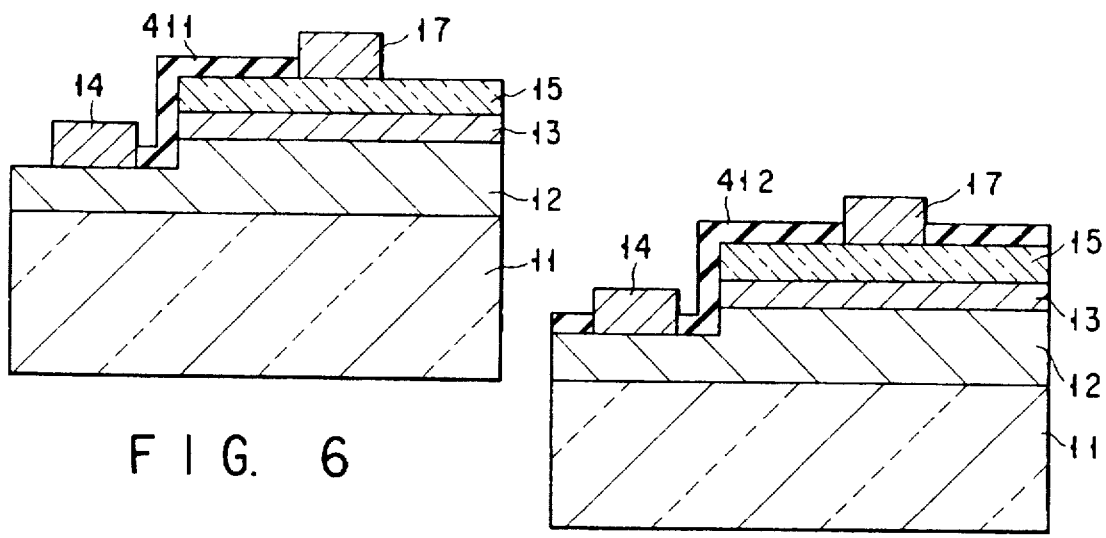
FIG. 6
FIG. 7
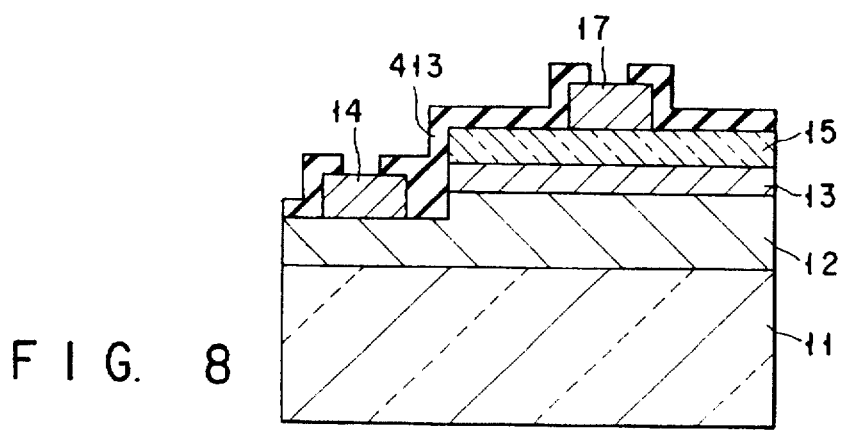
FIG. 8

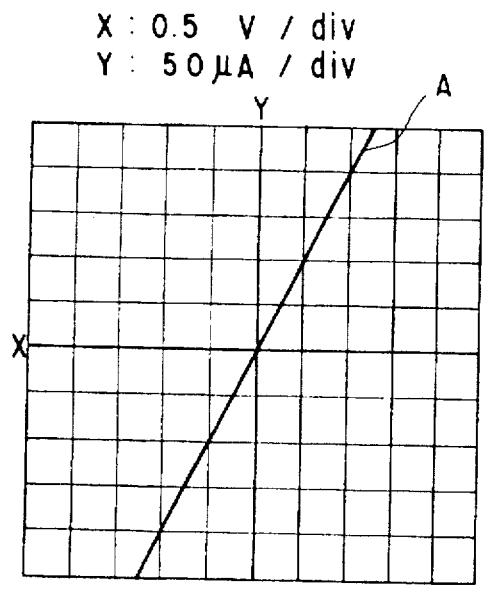
F I G. 12A
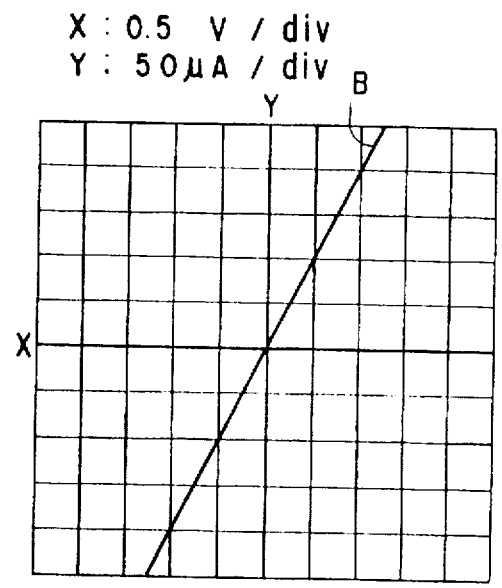
F I G. 12B
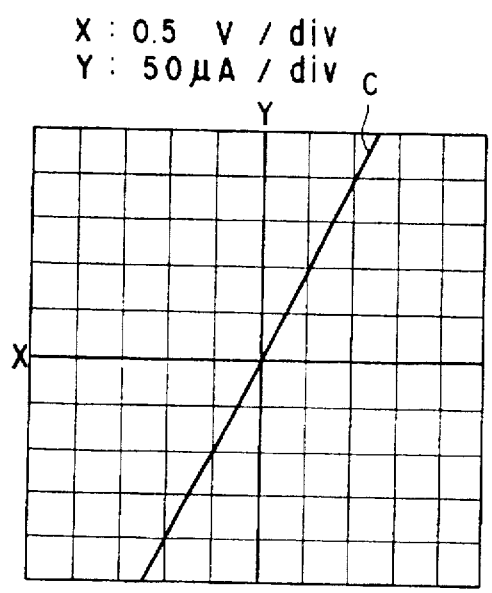
F I G. 12C
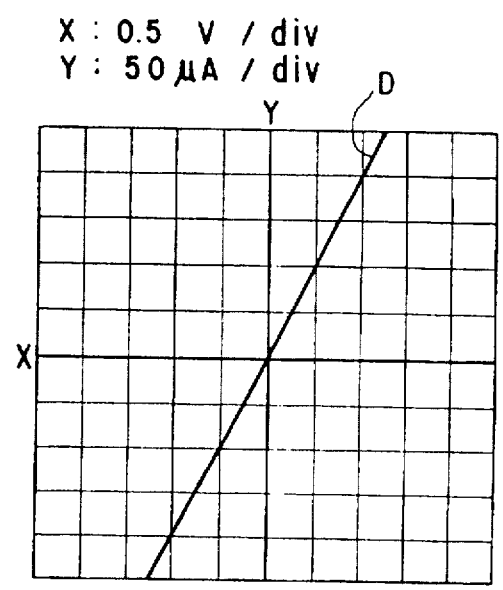
F I G. 12D X : 0.5 V / div
Y : 50 μA / div
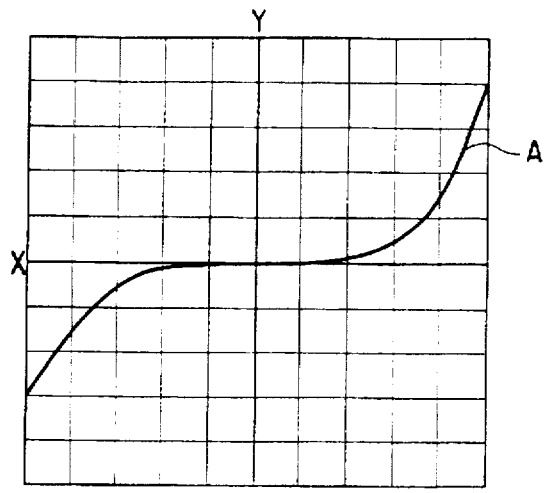
F I G. 13A
X : 0.5 V / div
Y : 50 μA / div
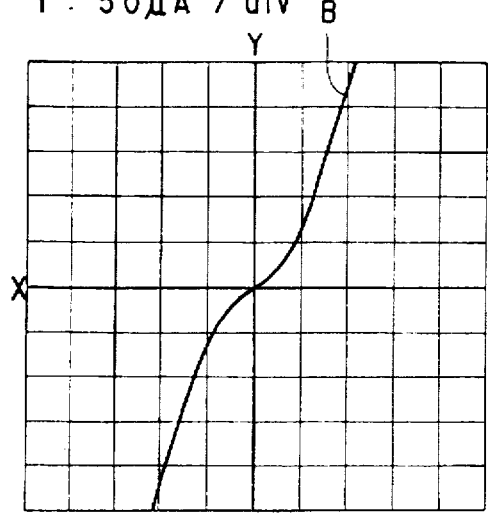
F I G. 13B
X : 0.5 V / div
Y : 50 μA / div
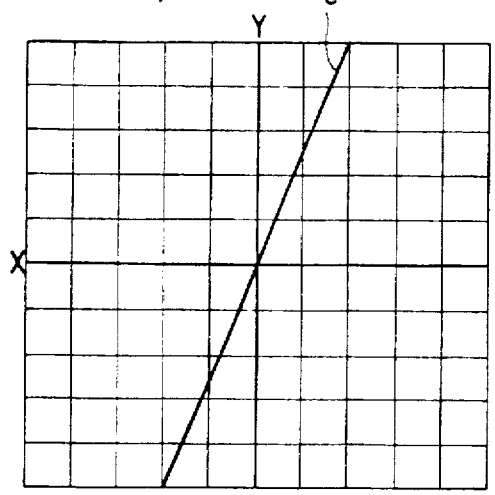
F I G. 13C
X : 0.5 V / div
Y : 50 μA / div
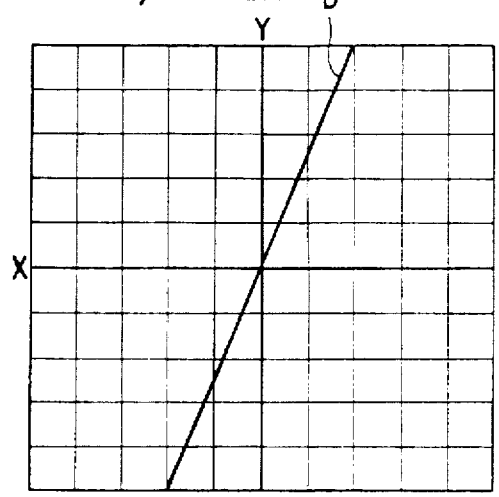
F I G. 13D

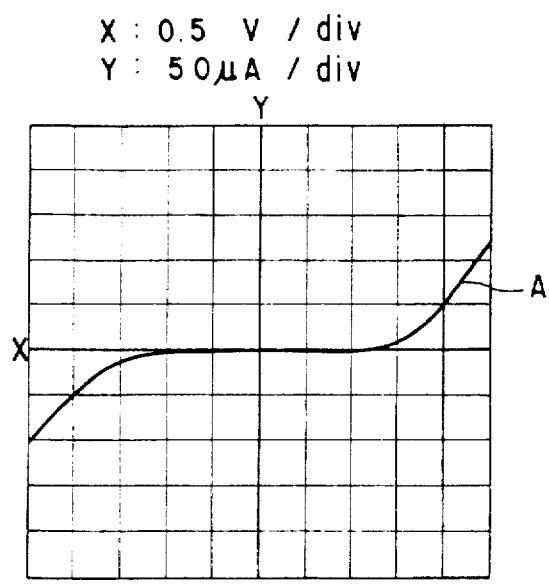
F I G. 14A
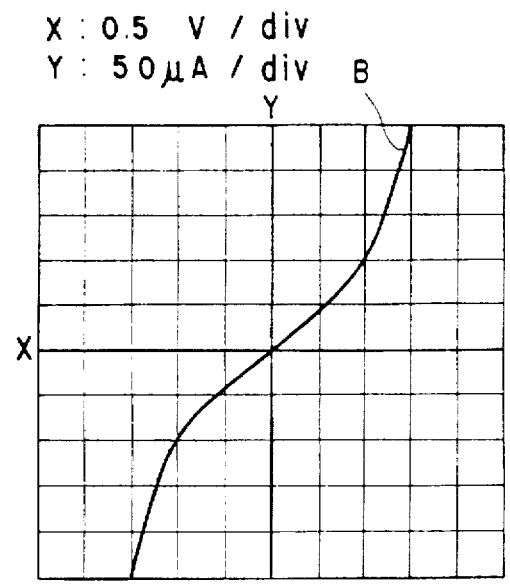
F I G. 14B
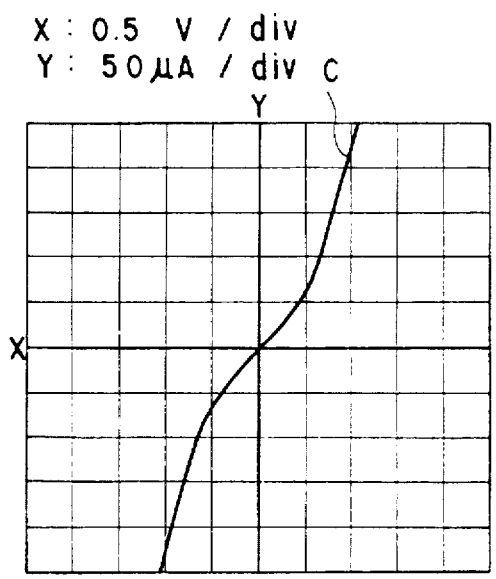
F I G. 14C
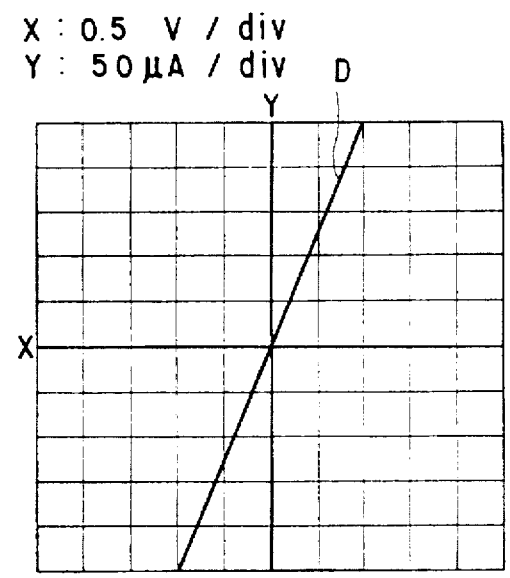
F I G. 14D

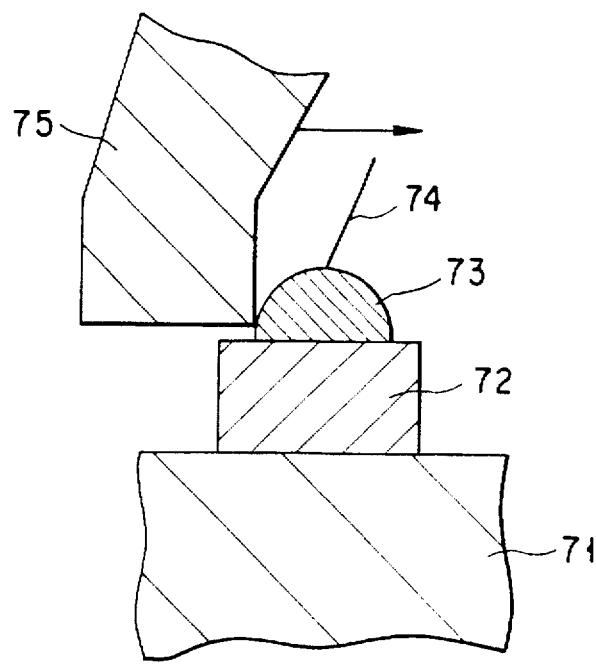
F I G. 15
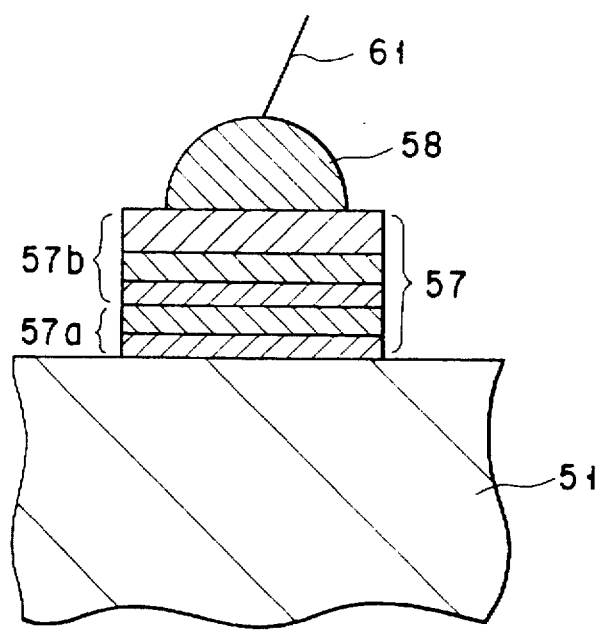
F I G. 16

5,767,581

1

GALLIUM NITRIDE-BASED III-V GROUP COMPOUND SEMICONDUCTOR

This is a rule 60 Division of application Ser. No. 08/232,001, filed Apr. 28, 1994, now U.S. Pat. No. 5,563,422, issued Oct. 8, 1996.

BACKGROUND OF THE INVENTION

1. Field of the Invention

The present invention relates to a gallium nitride-based III–V Group compound semiconductor device; and a method of producing the same.

2. Description of the Related Art

In recent years, a great deal of attention has been directed to light-emitting devices utilizing gallium nitride-based III–V Group semiconductors such as GaN, GaAlN, InGaN, and InAlGaN. Such a light-emitting device has a structure in which a layer of an n-type gallium nitride-based III–V Group compound semiconductor, and a layer of a gallium nitride-based III–V Group compound semiconductor doped with a p-type dopant are stacked on a substrate.

In the prior art, the layer of the gallium nitride-based III–V Group compound semiconductor doped with a p-type dopant remains as of high resistivity i-type. Therefore, the prior art device is of a so-called MIS structure. Recently, techniques to convert the high resistivity i-type compound semiconductor layer into a p-type layer has been disclosed in JP-A-2-257679, JP-A-3-218325, and JP-A-5-183189, and thus, it has now become possible to realize p-n junction type gallium nitride-based III–V Group semiconductor light-emitting devices, for example.

As such a p-n junction type gallium nitride-based III–V Group semiconductor devices have been being developed, it has become apparent that an electrode that is formed in direct contact with the p-type semiconductor layer or the n-type semiconductor layer has been encountered with various problems.

Presently, p-n junction type gallium nitride-based III–V Group semiconductor devices have a p-type compound semiconductor layer as the uppermost semiconductor layer due to the restriction imposed on the production thereof. Further, a transparent sapphire substrate is usually used for such a device. Different from a semi-conductive substrate used for the other semiconductor light-emitting device, sapphire is electrically insulative. Thus, it is not possible to mount, directly on the substrate, electrodes for supplying a predetermined current to the compound semiconductor layer to cause the device to emit light. A p-electrode and n-electrode must be formed in directly contact with the p-type compound semiconductor layer and the n-type compound semiconductor layer, respectively. The p-electrode is usually formed to cover substantially entire surface of the p-type compound semiconductor layer in order to ensure the uniform application of current to the entire p-type compound semiconductor layer, thereby obtaining uniform light emission from the device. However, since the prior art p-electrode is not light-transmissive, the light emitted from the prior art light-emitting device must be observed on the side of the substrate, which is opposite to the side on which the compound semiconductor layers are formed.

In mounting such a prior art compound semiconductor light-emitting device chip on lead frames, it is therefore necessary to place one such chip on two lead frames, with the p- and n-electrodes facing downward in order to direct upward the opposite side of the substrate on which no

2 semiconductor layers are formed. In short, one device chip must be seated astride the two separate lead frames. In this case, the two lead frames must be set apart from each other at a certain distance in order to avoid electrical short-circuit between the p-type and n-type compound semiconductor layers, which inevitably leads to a large size of a device chip, such as 1 mm square or more. This results in the decrease in the number of chips which can be cut out from one semiconductor wafer. Further, very precise positioning of the two lead frames, and fine etching techniques for the gallium nitride-based compound semiconductors are required.

Next, an n-electrode will be described.

As mentioned above, it is in recent years that p-n junction type gallium nitride-based III-v Group compound semiconductor devices can be realized. In the prior art devices of a MIS structure, an electrode utilizes a Schottky barrier with the high-resistivity i-type semiconductor layer, and almost no attention is directed to the n-electrode.

As a material for an n-electrode in the prior art gallium nitride-based III–V Group compound semiconductor light-emitting device, aluminum or an alloy thereof is disclosed in, for example, JP-A-55-942. Also, indium is often used. However, it has been found that aluminum and indium can hardly establish an ohmic contact with the n-type gallium nitride-based III–V Group compound semiconductor layer, and tend to degrade by an annealing treatment, losing the electrical conductivity.

In any event, there has been developed, in the prior art, no electrode materials that can establish a sufficiently satisfactory ohmic contact with a gallium nitride-based III–V Group compound semiconductor layers.

SUMMARY OF THE INVENTION

Therefore, it is an object of the present invention to provide a gallium nitride-based III–V Group compound semiconductor device provided with an electrode that establishes an ohmic contact with a gallium nitride-based III–V Group compound semiconductor layer provided in the device, and a method of producing the same.

Another object of the present invention is to provide a gallium nitride-based III–V Group compound semiconductor device provided with a p-electrode that allows observation of the light emitted from the device to be made from a side of the substrate on which a gallium nitride-based III–V Group compound semiconductor layer is provided, and a method of producing the same.

Still another object of the present invention is to provide a gallium nitride-based III–V Group compound semiconductor device provided with an n-electrode that establishes an ohmic contact with an n-type gallium nitride-based compound semiconductor layer provided in the device, and a method of producing the same.

In one aspect of the present invention, there is provided a gallium nitride-based III–V Group compound semiconductor device, comprising:

a substrate;

a semiconductor stacked structure arranged over the substrate, and comprising an n-type gallium nitride-based III–V Group compound semiconductor layer and a p-type gallium nitride-based III–V Group compound semiconductor layer;

a first electrode provided in contact with the n-type semiconductor layer; and a light-transmitting, second electrode provided in contact with the p-type semiconductor layer, and comprising a metallic material.

The second electrode (p-electrode) can be produced by forming a layer of a metallic material in contact with the p-type semiconductor layer, and annealing the metallic material layer, thereby rendering the metallic material layer light-transmissive and establishing an ohmic contact with the p-type semiconductor layer.

In a second aspect of the invention, a gallium nitride-based III–V Group compound semiconductor device, comprising:

a substrate;

a semiconductor stacked structure arranged over the substrate, and comprising an n-type gallium nitride-based III–V Group compound semiconductor layer and a p-type gallium nitride-based III–V Group compound semiconductor layer;

a first electrode provided in contact with the n-type semiconductor layer, and comprising titanium, and aluminum or gold; and a second electrode provided in contact with the p-type semiconductor layer.

The first electrode (n-electrode) can be produced by forming, in contact with the n-type semiconductor layer, a metallic layer of an alloy containing titanium and aluminum or gold, or a multi-layered structure comprising a layer of titanium, and a layer of aluminum or gold, and annealing the metallic layer or multi-layered structure, thereby establishing an ohmic contact with the n-type semiconductor layer.

In a third aspect of the present invention, there is provided a gallium nitride-based III–V Group compound semiconductor device, comprising:

a substrate;

a semiconductor stacked structure arranged over the substrate, and comprising an n-type gallium nitride-based III–V Group compound semiconductor layer and a p-type gallium nitride-based III-v Group compound semiconductor layer;

a first electrode provided in contact with the n-type semiconductor layer, and comprising titanium, and aluminum or gold; and a light-transmitting, second electrode provided in contact with the p-type semiconductor layer.

In a fourth aspect of the invention, there is provided a gallium nitride-based III–V Group compound semiconductor device, comprising a gallium nitride-based III–V Group compound semiconductor layer over a substrate, and an electrode which comprises a metallic material, and has been annealed so as to establish an ohmic contact with the semiconductor layer.

BRIEF DESCRIPTION OF THE DRAWINGS

FIG. 1 is a cross-sectional view, schematically illustrating a light-emitting device according to a first embodiment of[]the invention, with lead frames attached thereto;

FIG. 2 is a graph showing a current-voltage characteristic of a p-electrode of the invention, wherein one division of X axis is 0.5 V, and one division of Y axis is 0.2 mA;

FIG. 3 is an oblique view illustrating a light-emitting device according to a second embodiment of the invention;

FIG. 4 is a cross-sectional view, taken along the line IV—IV of FIG. 3;

FIG. 5 is an oblique view illustrating a modification of the second embodiment of the invention;

FIG. 6 is a cross-sectional view illustrating a light-emitting device according to a third embodiment of the invention;

FIG. 7 is a cross-sectional view illustrating a first modification of the third embodiment of the invention;

FIG. 8 is a cross-sectional view illustrating a second modification of the third embodiment of the invention;

FIGS. 12A to 12D are graphs showing current-voltage characteristics of different n-electrodes according to the invention, together with comparative examples, wherein one division of each X axis is 0.5 V, and one division of each Y axis is 50 μA;

FIGS. 13A to 13D are graphs showing current-voltage characteristics of different n-electrodes according to the invention, together with comparative examples, wherein one division of each X axis is 0.5 V, and one division of each Y axis is 50 μA;

FIGS. 14A to 14D are graphs showing current-voltage characteristics of different n-electrodes according to the invention, together with comparative examples, wherein one division of each X axis is 0.5 V, and one division of each Y axis is 50 μA;

FIG. 15 is a view for explaining a bonding test for n-electrodes;

FIG. 16 is a cross-sectional view partially illustrating a compound semiconductor light-emitting device according to a fifth embodiment of the invention.

DETAILED DESCRIPTION OF THE PREFERRED EMBODIMENTS

Figure 9:
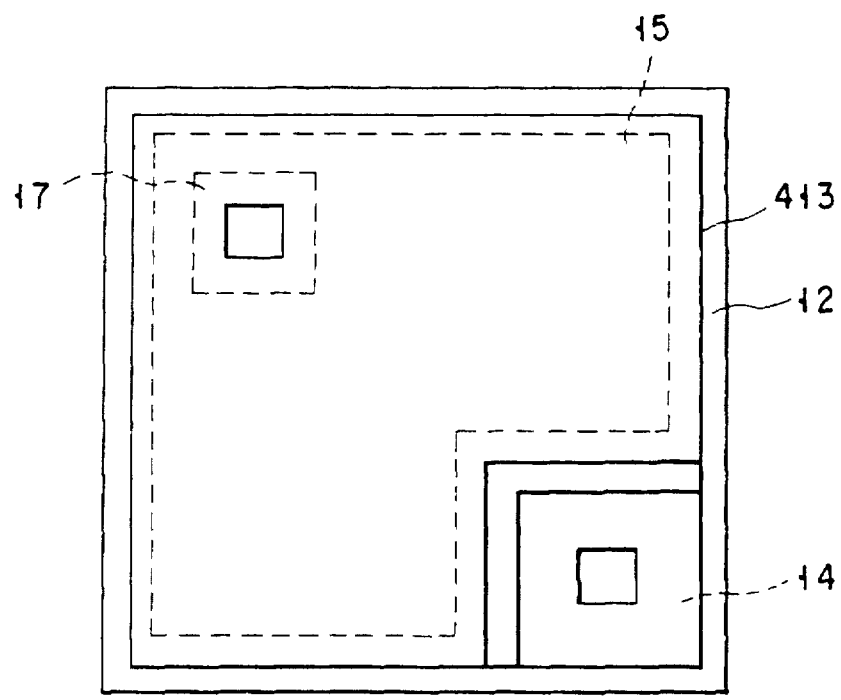
FIG. 9 is a cross-sectional view illustrating a third modification of the third embodiment of the invention.

In the present invention, the term "gallium nitride-based III–V Group compound semiconductor" means a nitride semiconductor of a Group III element containing gallium, such as GaN, GaAlN, InGaN, or InAlGaN. Such a compound semiconductor may be represented by the formula:

where $0 \leq x \leq 1$, $0 \leq y \leq 1$, and $x+y \leq 1$.

In the present invention, the term "ohmic" is used in a sense ordinarily used in the field of semiconductors.

In the present invention, the term "light-transmitting", or "light-transmissive" with respect to an electrode means that the electrode transmits at least 1% of the light emitted from the gallium nitride-based III–V Group compound semiconductor light-emitting device therethrough, and does not necessarily mean colorless, transparent. A light-transmitting electrode usually transmits 20 to 40% or more of the light emitted from the device therethrough.

Further, in the present invention, when a metallic material comprises or contains two or more metals, these metals may be alloyed with each other in advance, or the metallic material may be of a multi-layered structure in which layers of the metals are sequentially stacked. When a metallic material contains two or more metals, the content of each metal is not particularly limited. However, it is preferred that the material contains at least 1 atomic % of each metal.

The present invention will now be described below in detail with reference to the accompanying drawing FIGURES. Throughout the FIGURES, the same parts or portions are denoted by the same reference numerals.

FIG. 1 schematically shows a gallium nitride-based III–V Group compound semiconductor light-emitting device 10 according to a first embodiment of the present invention.

The light-emitting device (LED) 10 has a transparent and electrically insulating substrate 11, such as sapphire. A layer 12 of an n-type gallium nitride-based III–V Group compound semiconductor is formed to a thickness of, for example, 0.5 μm to 10 μm, on a first major surface 11a of the substrate 11. The n-type semiconductor layer 12 is preferably doped with an n-type dopant, such as silicon (Si), germanium (Ge), selenium (Se), sulfur (S) or tellurium (Te), though an n-type dopant may not be doped thereinto.

On the surface of the n-type semiconductor layer 12, a layer 13 of a p-type gallium nitride-based III–V Group compound semiconductor is formed to a thickness of, for example, 0.01 μm to 5 μm. The p-type semiconductor layer 13 is doped with a p-type dopant, such as beryllium (Be), strontium (Sr), barium (Ba), zinc (Zn) or magnesium (Mg), and has been annealed at a temperature of 400° C. or more (with respect to this annealing treatment, reference may be made to JP-A-5-183189 filed by the present assignee, or U.S. patent application Ser. No. 07/970,145 filed Nov. 2, 1992, and assigned to the present assignee, which is incorporated herein by reference).

The p-type semiconductor layer 13 is partially etched away, together with a surface portion of the n-type semiconductor layer, to partially exposing the surface of the n-type semiconductor layer 12. An n-electrode 14 is formed on the exposed surface portion of the n-type semiconductor layer 12.

A p-type electrode 15 of the invention is formed to directly cover a substantially entire surface of the p-type semiconductor layer 13. The p-electrode is a light-transmitting, ohmic electrode comprising a metallic material. The p-electrode may be formed of any suitable metallic material. The metallic material forming the p-electrode 15 may comprise one or more metals selected from gold, nickel, platinum, aluminum, tin, indium, chromium, and titanium. A metallic material achieving preferable ohmic characteristics contains at least two metals selected from chromium, nickel, gold, titanium and platinum. A particularly preferable metallic material contains gold and nickel. Gold and nickel are preferably formed such that a layer of nickel is formed in direct contact with the p-type semiconductor layer 13, and a layer of gold is formed on the nickel layer.

As mentioned before, where a metallic material for the p-electrode 15 contains two or more metals, these metals may be alloyed with each other in advance, or the metallic material may be of a multi-layered structure. The metals contained in the metallic material having such a multi-layered structure can form an alloy at an annealing treatment, which is described below.

The p-electrode 15 can be produced by forming a layer of a metallic material on the p-type semiconductor layer 13, using a conventional deposition technique, for example, vapor deposition or sputtering technique, and annealing the metallic material layer. The annealing treatment is preferably conducted at a temperature of 400° C. or more. The metallic material layer tends not to establish a good ohmic contact with the p-type semiconductor layer 13, when it is annealed at a temperature below 400° C. Needless to say, the annealing treatment should be effected at a temperature below the decomposition temperature (around 1,200° C.) of the gallium nitride-based III–V Group compound semiconductor. It is preferred that the annealing treatment in the present invention be conducted under a non-oxidative or inert atmosphere, such as nitrogen.

The effects of the annealing treatment performed on the p-electrode material are similar to those described in the above-mentioned U.S. Ser. No. 07/970,145. That is, a gallium nitride-based III–V Group compound semiconductor grown by a vapor phase growth method and doped with a p-type dopant decreases in its resistivity, when it is annealed at a temperature of 400° C. or more. This is because the hydrogen atoms bonded to the acceptor impurities in the as-grown compound semiconductor are expelled off by the annealing at 400° C. or more, to activate the acceptor impurities. Thus, a carrier concentration in the compound semiconductor effectively increases to obtain a satisfactory ohmic contact, when the p-electrode material is annealed at a temperature of 400° C. or more. A preferable p-electrode material which establishes a superior ohmic contact with the p-type semiconductor layer comprises nickel and gold, regardless of whether or not it is light-transmissive.

A metallic material used for the p-electrode 15 is preferably formed such that the annealed material has a thickness of 0.001 μm to 1 μm. During annealing, the metallic material layer partially diffuses into the p-type semiconductor layer 15, and is partially scattered outside. By adjusting the thickness of the final electrode to 0.001 μm to 1 μm, the p-electrode can be rendered light-transmissive. A thickness exceeding 1 μm may be used, but the metallic material layer tends to become more metallic-colored, lowering the light-transmissivity. From the light-transmitting point of view, p-electrode 15 is preferably thinner within the above thickness range. However, too small a thickness tends to increase the contact resistance between the electrode 15 and the p-type semiconductor layer 13. Accordingly, the thickness of the p-electrode 15 is more preferably 0.005 μm to 0.2 μm, and most preferably 0.01 μm to 0.2 μm.

The p-type electrode is light-transmissive, and establishes a preferable ohmic contact with the p-type semiconductor layer, lowering a forward voltage of the light-emitting device, thereby enhancing the light-emitting efficacy of the device.

Experiment 1

On a p-type GaN layer doped with zinc, a layer of nickel having a thickness of 0.1 μm, and then a layer of gold having a thickness of 0.1 μm were vapor-deposited, and annealed at 600° C. to alloy them, preparing a light-transmitting p-electrode. The thickness of the electrode was 0.03 μm. The current-voltage characteristic of this p-electrode is shown by line A in FIG. 2. As seen from the FIGURE, this p-type electrode establishes a good ohmic contact with the p-type gallium nitride-based III–V Group compound semiconductor.

Returning to FIG. 1, the light-emitting device of the present invention having a light-transmissive, ohmic p-electrode 15 allows to observe the light emitted therefrom through the p-electrode 15. Therefore, as shown in FIG. 1, the device can be mounted on a cup-type lead frame 18 which is generally used for mounting a light-emitting device utilizing semiconductors other than gallium nitride-based III–V Group compound semiconductors. As shown, the bottom surface of the substrate, on which no semiconductor layers are formed, i.e., a second major surface 11b opposite to the major surface 11a, is directed to the lead frame 18.

The p-type electrode 15 is connected with a bonding wire 21, such as a gold wire, at a bonding pad 17 formed on a portion of the surface of the p-type electrode 15. The bonding wire is, in turn, connected with a separate lead frame (metal post) 19. The n-electrode 14 is connected with the cup-like lead frame 18 through a bonding wire 20, such as a gold wire.

In a preferred embodiment of the present invention, the bonding pad 17 is preferably formed of gold alone, or a metallic material containing at least two metals including gold, and not containing aluminum or chromium. Such a metallic material may preferably comprise gold, and titanium, nickel, indium and/or platinum. These metallic materials exhibit a good adhesion with the p-electrode 13, and also exhibit a good adhesion with a metallic ball formed from a bonding wire during the wire bonding. Further, these metallic materials do not migrate into the p-electrode to degrade it (reduce the light-transmissivity) during the annealing treatment or during the application of the current to the device to emit light. A metallic material containing chromium or aluminum migrates into the p-electrode in a relatively short period of time (for example, 500 hours) during the application of the current, degrading the p-electrode.

Experiment 2

A bonding pad was formed on a p-electrode 15 of the device, as shown in FIG. 1, having a sapphire substrate as the substrate 15, a 4 μm thick n-type GaN layer as the n-type semiconductor layer 12, and a 1 μm thick p-type GaN layer doped with magnesium as the p-type semiconductor layer 13. The p-electrode 15 was produced by forming a nickel layer to a thickness of 0.1 μm and then a gold layer to a thickness of 0.1 μm, and annealing these layers at 600° C. to alloy them and render the electrode light-transmissive. The thickness of the p-electrode thus formed was 0.05 μm.

Each bonding pad was formed from each of various metallic materials shown in Table 1 below such that a layer of a metal on the row of Table 1 was vapor-deposited directly on the p-electrode, and a layer of a metal on the line of Table 1 was vapor-deposited thereon. These metal layers were annealed simultaneously with the annealing of the p-electrode. The bonding wire was a gold wire.

Each device thus fabricated was caused to emit light continuously for 500 hours, and the influences of the bonding pad on the p-electrode were examined. The results are also shown in Table 1.

TABLE 1

| Row | Line | | | | | | |
|---|---|---|---|---|---|---|---|
| | Au | Ni | Ti | In | Pt | Al | Cr |
| Au | VG | VG | G | G | G | B | B |
| Ni | VG | — | — | — | — | B | — |
| Ti | G | — | — | — | — | B | — |
| In | G | — | — | — | — | B | — |
| Pt | G | — | — | — | — | B | B |
| Al | B | B | B | B | B | B | B |
| Cr | B | — | — | — | — | B | — |

In Table 1, the symbol, VG, stands for "very good", and indicates that the bonding pad remained light-transmissive, maintaining the initial light-transmissivity, and the ohmic property between the p-electrode and the p-type semiconductor layer was not changed. The symbol, G, stands for "good", and indicates that the portion of the p-electrode around the bonding pad is slightly color-changed, but not significantly attenuating the light form the device, and the ohmic property between the p-electrode and the p-type semiconductor layer was not changed. The symbol, B, stands for "bad", and indicates that the light-transmissivity of the p-electrode was lost, and also the ohmic property between the p-electrode and the p-type semiconductor layer was lost. The symbol "—" indicates that the bonding pad was poor in adhesion with the gold ball, and thus the wire bonding was difficult to perform.

As shown in Table 1, when the bonding pad is formed of the same metallic material as the p-electrode, i.e., Ni—Au, the p-electrode is not color-changed at all, and maintains the initial light-transmissivity. The same advantages are obtained when the bonding pad is formed of gold. However, Cr or Al readily migrated into the p-electrode to degrade the characteristics of the p-electrode, even if gold was contained therein.

Experiment 3

Experiments were conducted in the same manner as in Experiment 2, except that the p-electrode was formed of Au—Ti (this p-electrode was slightly inferior to the Ni—Au electrode in the ohmic property). As a result, the bonding pad formed of gold alone or Au—Ti obtained the result of "VG". The bonding pad formed of gold and a metal other than aluminum or chromium (i.e., nickel, titanium, indium or platinum) obtained the result of "V". The bonding pad formed of a metallic material containing gold and aluminum or chromium obtained the result of "B".

Experiment 4

Experiments were conducted in the same manner as in Experiment 2, except that the p-electrode was formed of Au—Al (this p-electrode was slightly inferior to the Ni—Au electrode in its ohmic property). As a result, the bonding pad formed of gold alone obtained the result of "VG". The bonding pad formed of gold and a metal other than aluminum and chromium (i.e., nickel, titanium, indium or platinum) obtained the result of "V". However, the bonding pad formed of gold and aluminum obtained the result of "B", though it was the same material as the p-electrode. Further, the bonding pad formed of gold and chromium also obtained the result of "B".

FIG. 3 is a plan view of a semiconductor light-emitting device according to a second embodiment of the present invention. FIG. 4 is an enlarged cross-sectional view, taken along the line IV—IV of FIG. 3. This embodiment relates to an improvement in a bonding pad for the p-electrode. As shown in these FIGURES, a cut-off portion 311 is provided in the p-electrode 15, exposing a portion of the surface of the p-type semiconductor layer 13. A bonding pad 32 strongly adheres to the p-type semiconductor layer 13 through the cut-off portion 311, and is electrically connected with the p-electrode 15. In the embodiment shown, the bonding pad 32 not only fills the cut-off portion 311, but also extends over a portion of the p-electrode 15 around the cut-off portion 311. Preferably, the cut-off portion 311, and hence the bonding pad 32, are arranged farthest from the n-electrode 14 provided on the n-type semiconductor layer 12 (the same also applies to the device of FIG. 1). With such an arrangement, the applied current can spread throughout the entire p-type semiconductor layer 13 to obtain a uniform light output from the device. In the embodiment shown, the cut-off portion (window) 311 is arranged at a corner portion of the light-transmissive p-electrode 15, and the n-electrode 14 is arranged at an opposite corner portion of the n-type semiconductor layer 12, on a diagonal line of the square wafer.

Because the ohmic contact with the p-type semiconductor layer 13 is provided by the p-electrode 15, the bonding pad 32 may be formed of a metallic material which does not form an ohmic contact with the p-type semiconductor layer 13, though it may be formed of a metallic material establishing such an ohmic contact. The bonding pad 32 should be formed of a metallic material which adheres to the p-type semiconductor layer 13 more strongly than the p-electrode 15. Since the bonding pad 32 adheres to the p-type semiconductor layer 13 more strongly than the p-electrode 15, the bonding pad 13 and/or the p-electrode 15 is prevented from peeling off the substrate, even if the bonding pad 32 is pulled by a bonding wire, such as a gold wire, during the wire bonding operation. Such a material for the bonding pad includes aluminum alone, or a metallic material containing at least two metals selected from the group consisting of chromium, aluminum and gold. When a metallic material forming the bonding pad 32 contains two or more metals, these metals may be alloyed in advance, or the metallic material may comprises a layer of one metal, and a layer of the other metal stacked thereon, as mentioned before. The metals in the multi-layered structure can be simultaneously alloyed at time of the annealing treatment conducted on the p-electrode 15. These metallic materials may not establish a good ohmic contact with the p-type semiconductor layer 13, but strongly adheres to the p-type semiconductor material, and does not peel off from the wafer during the wire bonding operation. Therefore, these metallic materials may have so small a thickness as to be light-transmissive. Such a thin film bonding pad transmits the light emitted from the device therethrough, and does not significantly reduce the light output of the device. Further, the bonding pad 32 may be of a multi-layered structure in which a layer directly contacting the p-electrode 15 is formed of a metallic material which more strongly adheres to the p-type semiconductor layer 13, and the uppermost layer is formed of a metal which more strongly adheres to the material forming the bonding wire.

Experiment 5

1,000 light-transmissive bonding pads were prepared on a p-type GaN layer by sequentially vapor-depositing a nickel layer and then a gold layer to a total thickness of 0.01 μm. On the other hand, each of Cr—Al, Al—Au, Cr—Au, and Al alone was vapor-deposited on a p-type GaN layer to a total thickness of 0.01 μm to provide 1,000 bonding pads on each p-type GaN layer. The bonding pads were bonded with corresponding gold wires, and the number of bonding pads which were peeled off, when the gold wires were released, was counted to determine the yield of the bonding pads. The yield of the bonding pads formed of Ni—Au was about 60%, but the yield of each of the other bonding pads was 98% or more.

Meanwhile, the bonding strength with the p-type semiconductor layer 13 may be enhanced by making larger the thickness of the bonding pad 32. The thick bonding pad does not exhibit light-transmissivity, but may form an ohmic contact if formed of the same material as the p-electrode.

FIG. 5 shows a device similar to the device of FIG. 4, except that a cut-off portion 312 is provided such that a corner portion of the light-transmitting p-electrode 15 is cut away. In FIG. 5, the bonding pad filling the cut-off portion 312 is not shown, in order to clearly illustrate the cut-off portion 312.

FIG. 6 illustrate a light-emitting device according to a third embodiment of the invention, and shows a structure similar to the device of FIG. 1, except that an electrically insulating, transparent protective film (protective film 411) covers the thin, light-transmissive p-electrode 15. The protective film has a transparency such that it may transmit 90% or more of the light therethrough. The protective film is insulative, and thus prevents short-circuiting between the p-electrode 15 and the metallic ball that is formed on the n-electrode 14 during the wire bonding operation and remains there, even if the metallic ball is contacted with the p-electrode 15. Further, the protective film is transparent, and thus transmits the light emitted from the device therethrough. Accordingly, the protective film does not reduce the external quantum efficiency of the device. Further, the protective film protects the thin p-electrode 15 from being scratched, and prevents the bonding pad 17 or the p-electrode 15 from peeling off, even when pulled by the bonding wire during the wire bonding operation.

The material forming the protective film is not particularly limited, as long as it is transparent, and electrically insulative. A preferable material includes silicon oxide, titanium oxide, aluminum oxide, or silicon nitride. These materials are colorless, transparent, regardless of how thick it is formed, and are electrically insulative. Therefore, the protective films made of these materials does not substantially attenuate the light emitted from the device. The protective film can be formed by the conventional vapor deposition or sputtering technique. The thickness of the protective film is not particularly limited, but is usually 0.001 μm to 10 μm.

The metallic ball formed from the bonding wire tends to bridge the n-electrode 14 and the p-electrode 15 during the wire bonding operation at a region between the n-electrode 14 and the bonding pad 17. Therefore, the protective film 411 shown in FIG. 6 covers such a region entirely.

FIG. 7 shows a structure similar to the structure of FIG. 6, except that the protective film (protective film 412) covers the entire exposed surface of the p-electrode 15, the exposed edge surface of the p-type semiconductor layer 13, and the exposed surface of the n-type semiconductor layer 12. Therefore, the reliability of the device shown in FIG. 7 is more improved over that of the device of FIG. 6.

FIG. 8 shows a structure similar to the structure of FIG. 6, except that the protective film (protective film 413) continuously covers almost entire surface of the wafer excluding a bonding portion of the n-electrode 14, for bonding with a bonding wire, and a bonding portion of the bonding pad 17, for bonding with a bonding wire. By forming the protective film 413 also on the surface of the bonding pad 17, the bonding pad 17 becomes further pressed against the p-electrode 15, preventing the bonding pad 17 from peeling off the p-electrode 15. The protective film 413 also covers the n-electrode 14, preventing the n-electrode 14 from peeling off the n-type semiconductor layer 12. Thus, a device having a superior reliability is provided.

FIG. 9 shows a structure similar to the structure of FIG. 8, except that the n-electrode 14 and the bonding pad 17 are arranged at corner portions opposite to each other on a diagonal line of the square wafer. The advantages described with reference to FIG. 3 can also be obtained by this arrangement.

Next, an n-electrode of the present invention will be described.

An n-electrode according to the present invention is formed of a metallic material comprising titanium, and aluminum and/or gold, such as a metallic material containing titanium and aluminum, a metallic material containing titanium and gold, or a metallic material containing titanium, aluminum and gold. These metals may be alloyed in advance, or the metallic material may be of a multi-layered structure in which layers of the metals are sequentially stacked, as mentioned before. The n-electrode formed of such a metallic material establishes an excellent ohmic contact with an n-type gallium nitride-based III–V Group compound semiconductor layer when annealed.

The annealing temperature is particularly preferably 400° C. or more. The annealing treatment is preferably conducted for 0.01 to 30 minutes, and under a non-oxidative or inert atmosphere such as nitrogen as described previously.

Generally, a gallium nitride-based III–V Group compound semiconductor has a property to become n-type without doping an n-type dopant thereinto, since nitrogen lattice vacancies are created in the grown crystal. The compound semiconductor exhibits a more preferable n-type conductivity when doped with an n-type dopant such as silicon, germanium, selenium, or sulfur. Gallium nitride-based III–V Group compound semiconductors are usually grown by a vapor phase growth method such as metalorganic chemical vapor deposition (MOCVD or MOVPE), hydride chemical vapor deposition (HDCVD), or molecular beam epitaxy (MBE). In such a growth method, compounds are used, which contains hydrogen atoms, such as trimethylgallium as a gallium source, and ammonia or hydrazine as a nitrogen source, and also hydrogen gas as a carrier gas. The gaseous compounds which contain hydrogen atoms are thermally decomposed during the growth of the gallium nitride-based III–V Group compound semiconductor and release hydrogen. The released hydrogen atoms are trapped in the growing compound semiconductor, and combine with the nitrogen lattice vacancies or the n-type or p-type dopant, to inhibit their functions. It is believed that when the n-electrode material or the p-electrode material is annealed at a temperature of 400° C. or more, the hydrogen trapped in the semiconductor crystal is expelled off, to activate the n-type or p-type dopant, thereby effectively increasing the electron carrier concentration or the hole carrier concentration in the semiconductor crystal, and establishing an ohmic contact. This effect of annealing is similar to the effect of annealing on a gallium nitride-based III–V Group compound semiconductor doped with a p-type dopant as described in the abovementioned JP-A-5-183189 or U.S. Ser. No. 07/970,145. These patent documents disclose that a gallium nitride-based III–V Group compound semiconductor doped with a p-type dopant gradually decreases in its resistivity starting from the annealing at 400° C., and exhibits a constant resistivity when annealed at 700° C. or more. With the n-type gallium nitride-based III–V Group compound semiconductor of the present invention, the resistivity gradually decreases, starting from the annealing at 400° C., but does not show a sharp decrease. The n-type semiconductor exhibits a resistivity as low as ½ of the initial resistivity by the annealing treatment at 600° C., and no more decreases in its resistivity at a higher temperature.

The annealing is conducted on the n-electrode material preferably at 500° C. or more, and more preferably 600° C. or more. When the n-electrode material contains aluminum, a lower annealing temperature suffices, with 450° C. or more being preferable, and 500° C. or more being more preferable. The annealing should be conducted at a temperature lower than the decomposition temperature of the gallium nitride-based III–V Group compound semiconductor, as mentioned before. The thickness of the n-electrode is not particularly limited, but it is usually 50 angstroms or more, preferably 0.01 µm to 5 µm.

The n-electrode material of the invention comprising titanium, and aluminum and/or gold is preferably of a multi-layered structure in which layers of the metals are sequentially stacked. In this case, it is preferred that a layer of titanium be provided in direct contact with the n-type gallium nitride-based III–V Group compound semiconductor layer. Titanium can form a more preferable ohmic contact with the n-type gallium nitride-based III–V Group compound semiconductor layer. In such a case, the titanium layer is preferably formed to a thickness of 20 angstroms to 0.3 µm. A total thickness of the aluminum and/or gold layer subsequently formed is preferably larger than the thickness of the titanium layer. By forming the subsequent layer or layers to a such a total thickness, the titanium can be prevented from migrating onto the surface to lower the bonding strength of the n-electrode with the bonding wire or the metallic ball at the wire bonding.

An n-electrode material of the invention comprising titanium and gold, or comprising titanium, gold and aluminum has an anti-oxidation property improved over that of an n-electrode material comprising titanium and aluminum, and strongly adheres to the gold ball formed during the wire bonding. Further, an n-electrode material of the invention comprising gold is preferably has a multi-layered structure in which a gold layer constitutes the uppermost layer. Naturally, the gold layer very strongly adheres to the gold ball.

Figure 10:
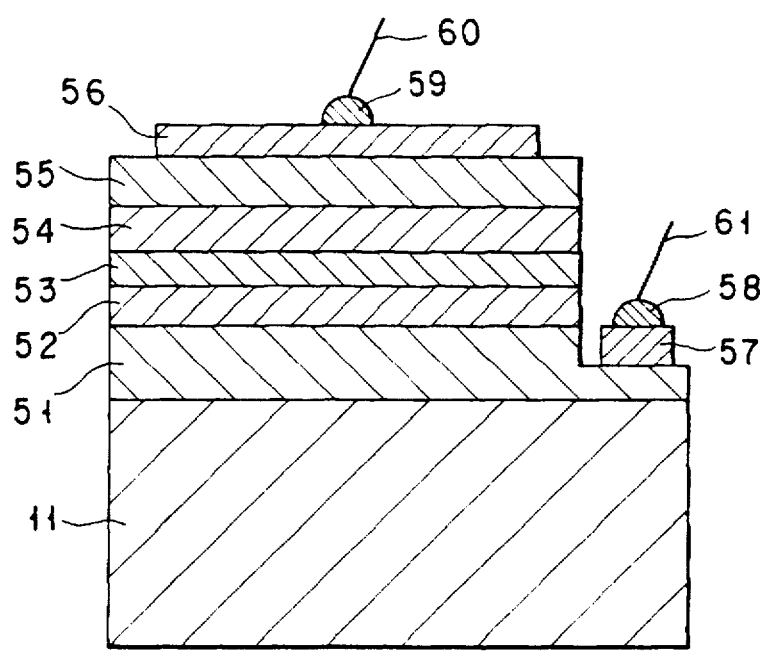
FIG. 10 is a cross-sectional view illustrating a compound semiconductor light-emitting device according to a fourth embodiment of the invention.

FIG. 10 illustrates a light-emitting device according to a fourth embodiment of the invention, and shows a device of a double heterostructure having an n-electrode of the invention. This device has an n-type gallium nitride-based III–V Group compound semiconductor layer 51 having a thickness of, for example, 1 µm to 10 µm, formed over the substrate 11 through a buffer layer (not shown) formed of, for example, an undoped GaN having a thickness of 0.002 µm to 0.5 µm.

On the n-type semiconductor layer 51, a first clad layer 52 is provided, which is formed of an n-type gallium nitride-based III–V Group compound semiconductor, for example, an n-type GaAlN doped with an n-type dopant such as silicon. The first clad layer 52 usually has a thickness of 0.01 to 5 µm, preferably 0.1 to 4 µm.

On the first clad layer 52, an active layer (light-emitting layer) 53 is provided, which is formed of a gallium nitride-based III–V Group compound semiconductor having a semiconductor composition different from the clad layer 52. The active layer 53 is preferably formed of a low-resistivity $In_aGa_{1-a}N$, where 0<a<1, doped with an n-type or p-type dopant, preferably an n-type dopant. The active layer 53 has a thickness of 10 angstroms to 0.5 µm, preferably 0.01 µm to 0.2 µm.

On the active layer 53, a second clad layer 54 is provided, which is formed of a p-type gallium nitride-based III–V Group compound semiconductor having a semiconductor composition different from the active layer 53, for example, a p-type GaAlN doped with a p-type dopant such as magnesium The second clad layer 54 has a thickness of, usually, 0.01 µm or more, preferably 0.1 µm to 1 µm.

On the second clad layer 54, a contact layer 55 is provided, which is formed of a p-type gallium nitride-based III–V Group compound semiconductor such as a p-type GaN.

A p-electrode 56 is provided on the contact layer 54. The p-type electrode 56 may be formed of any suitable, electrically conductive metallic material. A p-electrode material that exhibits a good ohmic property includes a metallic material comprising nickel and gold. Nickel and gold may be alloyed in advance. However, the metallic material comprising nickel and gold particularly preferably has a multi-layered structure in which a nickel layer and a gold layer are sequentially stacked. In the latter case, the nickel layer is preferably provided in direct contact with the contact layer 55. Of course, the light-transmitting p-electrode 15, and further the bonding pad 32, described with reference to the embodiments previously explained, may be applied to the device of FIG. 10. The p-electrode 56 is connected with a bonding wire 60 through a metallic ball 59.

The wafer shown is partially etched away from the contact layer 55 to a surface portion of the n-type semiconductor layer 51 in the direction of the thickness, partially exposing the n-type semiconductor layer 51. An n-electrode 57 of the present invention is provided on the exposed surface portion of the n-type semiconductor layer 51. The n-electrode 57 is connected with a bonding wire 61 through a metallic ball 58.

Experiment 6

Figure 11A:
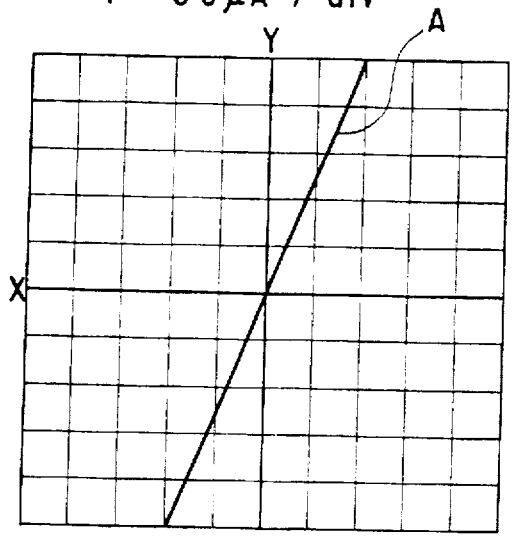
FIGS. 11A to 11D are graphs showing current-voltage characteristics of different n-electrodes according to the invention, together with comparative examples, wherein one division of each X axis is 0.5 V, and one division of each Y axis is 50 μA.
Figure 11B:
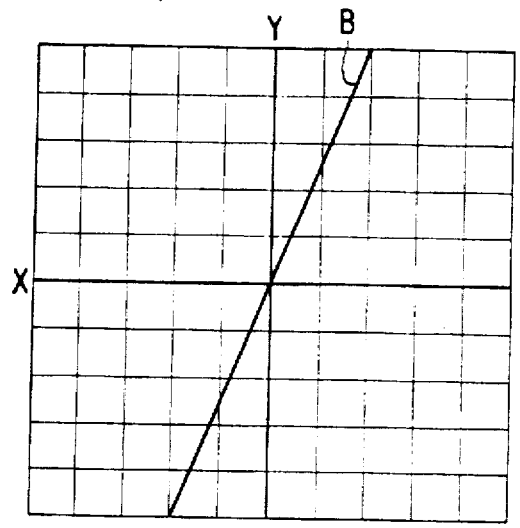
Figure 11C:
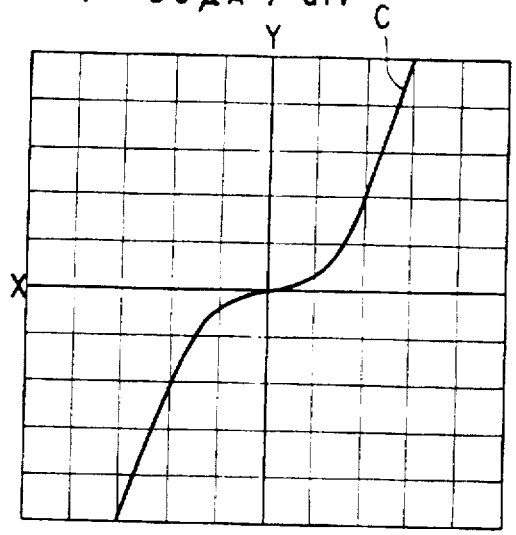
Figure 11D:
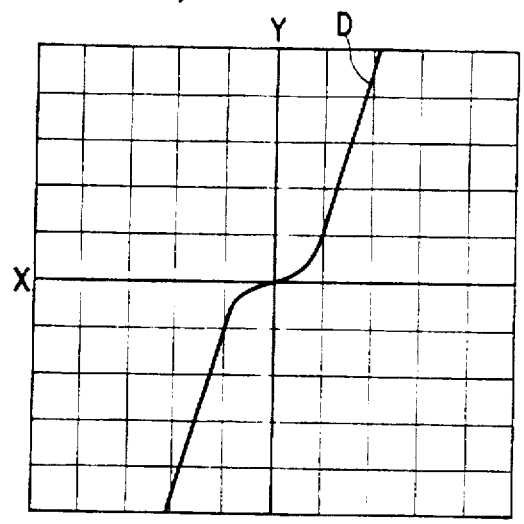

An n-type GaN layer having a thickness of 4 μm was formed on a sapphire substrate having a diameter of 2 inches. On the n-type GaN layer, 1,000 n-electrodes having a diameter of 100 μm were vapor-deposited using each of various n-electrode material, and annealed at 450° C. The current-voltage characteristics were measured among the electrodes of the same material. The results are shown in FIGS. 11A to 11D. FIG. 11A relates to the 1,000 electrodes formed by depositing titanium and then aluminum at a thickness ratio of 0.01:1, and FIG. 11B relates to the 1,000 electrodes formed by depositing an Al—Ti alloy containing 1% by weight of titanium. FIG. 11C relates to the 1,000 electrodes formed by depositing titanium alone, and FIG. 11D relates to the 1,000 electrodes formed by depositing aluminum alone. These FIGURES show the representative results of the electrodes, respectively. As shown in FIGS. 11A and 11B, the electrodes comprising aluminum and titanium form a good ohmic contact with the n-type GaN layer. Each 1,000 electrodes all established a good ohmic contact with the n-type GaN as shown in FIGS. 11A and 11B. On the other hand, the electrodes formed of titanium alone or aluminum alone did not provide a good ohmic contact, as shown in FIGS. 11A and 11B, and, of these, only a few electrodes indicated the ohmic characteristics as shown in FIG. 11A or FIG. 11B.

Further, the electron microscopic observation indicated the electrodes formed of titanium alone or aluminum alone were blackened in 90% or more of their surface area.

Experiment 7

An n-type $Ga_{0.9}Al_{0.1}N$ layer having a thickness of 0.2 μm was formed on a sapphire substrate having a diameter of 2 inches. On the n-type GaAlN layer, 1,000 n-electrodes having a diameter of 100 μm were formed by vapor-depositing a multi-layered metallic material comprising a titanium layer and an aluminum layer, with the thickness ratio of the titanium and aluminum layer varied, and annealing them at 450° C. The current-voltage characteristics were measured among the electrodes of the same material. The results are shown in FIGS. 12A to 12D. FIG. 12A relates to the 1,000 electrodes formed by depositing the titanium layer and then the aluminum layer at a thickness ratio of 0.001:1, and FIG. 12B relates to the 1,000 electrodes formed by depositing the aluminum layer and then the titanium layer at a thickness ratio of 0.001:1. FIG. 12C relates to the 1,000 electrodes formed by depositing the titanium layer and then the aluminum layer at a thickness ratio of 1:0.001, and FIG. 12D relates to the 1,000 electrodes formed by depositing the aluminum layer and then the titanium layer at a thickness ratio of 1:0.001. These FIGURES show that all the electrodes formed of titanium and aluminum exhibit good ohmic characteristics, regardless of the ratio of titanium and aluminum contained in the electrode. Further, all the Ti—Al electrodes in which the titanium layer was formed in direct contact with the n-type semiconductor layer exhibited the good ohmic characteristics as shown in FIGS. 12A and 12B, but some of the Al—Ti electrodes in which the aluminum layer was formed in direct contact with the n-type semiconductor layer did not exhibit preferable ohmic characteristics. The electron microscopic observation indicated all the electrodes prepared in this Experiment were not degraded.

Experiment 8

On an n-type GaAlN layer doped with silicon, a titanium layer having a thickness of 0.03 μm was first vapor-deposited, then an aluminum layer having a thickness of 0.5 μm was vapor-deposited, and finally a gold layer having a thickness of 0.5 μm was vapor-deposited. The multi-layered structure was annealed at various temperatures for 5 minutes. The current-voltage characteristics were measured on the electrodes thus obtained. The results are shown by lines A to D in FIGS. 13A to 13D, respectively. FIG. 13A relates to the annealing at 300° C., FIG. 13B relates to the annealing at 400° C., FIG. 13C relates to the annealing at 500° C., and FIG. 13D relates to the annealing at 600° C. As seen from these FIGURES, the electrode did not exhibit preferable ohmic characteristics with the n-type semiconductor layer, when annealed at 300° C. (FIG. 13A), but the electrodes exhibited preferable ohmic characteristics when annealed at 400° C. or more (FIG. 13B to FIG. 13D). The similar results were obtained when the n-electrode was prepared by depositing an alloy of titanium and aluminum.

Experiment 9

Experiments were conducted as in the same manner as in Experiment 8, except that a titanium layer having a thickness of 0.03 μm was vapor-deposited on the n-type GaN layer doped with silicon, and then a gold layer having a thickness of 0.5 μm was vapor-deposited. The results are shown by lines A to D in FIGS. 14A to 14D, respectively. FIG. 14A relates to the annealing at 300° C., FIG. 14B relates to the annealing at 400° C., FIG. 14C relates to the annealing at 500° C., and FIG. 14D relates to the annealing at 600° C. As seen from these FIGURES, the electrode did not exhibit preferable ohmic characteristics with the n-type semiconductor layer, when annealed at 300° C. (FIG. 14A), but the electrodes exhibited preferable ohmic characteristics when annealed at 400° C. or more (FIG. 14B to FIG. 14D). The similar results were obtained when the n-electrode was prepared by depositing an alloy of titanium and gold.

It can be understood from the comparison of FIGS. 13A to 13D with FIGS. 14A to 14D that when aluminum is added to a metallic material containing titanium and gold, the resultant electrodes exhibits a preferable ohmic characteristics even when annealed at a lower temperature. The fact that preferable ohmic characteristics can be obtained at a lower annealing temperature brings about advantages that the thermal decomposition of gallium nitride-based III–V Group compound semiconductors can be suppressed, and thus their crystallinity can be maintained.

Experiment 10

The following experiments were conducted to determine the bonding strength between an n-electrode and a gold ball.

Referring to FIG. 15, 100 thin films of Al, or 100 multi-layered films of Ti—Al, Ti—Au, Ti—Au—Al or Ti—Al—Au, each having a diameter of 120 μm, were formed on an n-type GaN layer 61 doped with silicon, and annealed at 500° C. to prepare n-electrodes 62. The electrodes was subjected to a surface-oxidation by allowing them to stand in air for a day. Then, a gold wire 64 was ball-bonded to each electrode 62. A gold ball 63 having a diameter of 100 μm was formed during this operation. The ball 63 was clawed with an edged tool 65 from just beside the ball in a horizontal direction, while applying a load, until the ball 63 was peeled off, or crushed without peeling off. The results are shown in Table 2. In Table 2, the value under each load value column indicates the number of the balls peeled off the electrodes. It is indicated "crushed" where the ball was not peeled off, but was crushed.

TABLE 2

| Material | Load | | | | | |
|---|---|---|---|---|---|---|
| | 20 g | 30 g | 40 g | 50 g | 60 g | 70 g |
| Al | 95 | 5 | — | — | — | — |
| Ti—Al | 93 | 7 | — | — | — | — |
| Ti—Au—Al | 0 | 0 | 6 | 25 | 69 | — |
| Ti—Al—Au | 0 | 0 | 0 | 1 | 5 | crushed |
| Ti—Au | 0 | 0 | 0 | 0 | 1 | crushed |

As shown in Table 2, the n-electrode formed of titanium and gold, or titanium, aluminum and gold has an anti-oxidation property improved over the electrode formed of titanium and aluminum, and thus exhibits a higher bonding strength with the gold ball. Further, it is seen that, of the n-electrodes formed of titanium, aluminum and gold, a higher adhesion strength can be obtained when the uppermost layer is formed of gold, than when the uppermost layer is formed of aluminum.

In order to prevent the bonding strength, with the metallic ball, of an n-electrode material containing titanium and aluminum from lowering due to the oxidation, it is also preferable to cover the surface of the n-electrode material with a layer of a high-melting point metallic material having a melting point higher than aluminum. Such a high-melting point metallic material includes gold, titanium, nickel, platinum, tungsten, molybdenum, chromium and/or copper, with gold, titanium and/or nickel being most preferred. These materials exhibit a superior adhesion with a first metallic material layer containing titanium and aluminum, and do not separate from the first metallic material layer. Further, these metallic materials strongly bond with the metallic ball formed during the wire bonding. Most preferably, the high-melting point metallic material contains gold. A particularly preferable high-melting point metallic material contains gold and a high-melting point metallic material other than gold (preferably titanium and/or nickel). The high-melting point metallic material may be alloyed in advance, but is preferably of a multi-layered structure in which layers of the metals are sequentially stacked. In the latter case, the uppermost layer is preferably formed of gold, as mentioned before. After the stacked layer structure was formed, an annealing treatment is conducted under the above-mentioned conditions to obtain an n-electrode. The high-melting point metallic material prevents the aluminum contained in the underlying, first metallic material from migrating onto the surface, thereby preventing the oxidation of the aluminum.

FIG. 16 shows an n-electrode 57 of such a multi-layered structure. In FIG. 16, the n-electrode 57 has a fist thin film 57a of a multi-layered structure comprising a titanium layer and an aluminum layer, and formed on the n-type semiconductor layer 51. A second thin film of, for example, a multi-layered structure comprising layers of the high-melting point metallic materials is provided on the first thin film 57a.

Experiment 11

Figure 17A:
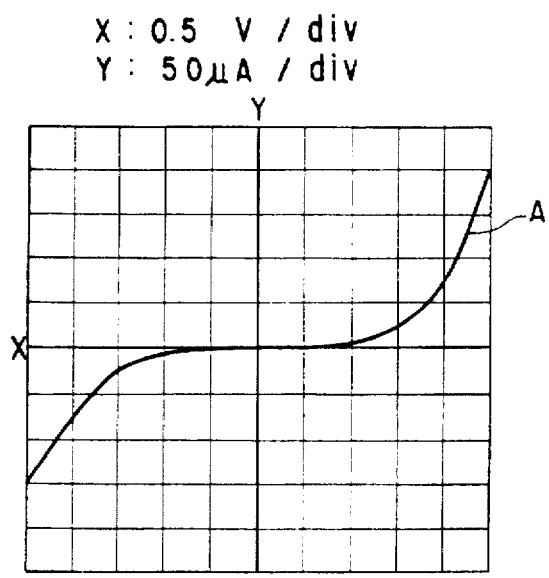
FIGS. 17A to 17D are graphs showing current-voltage characteristics of different n-electrodes in the fifth embodiment of the invention, together with comparative examples, wherein one division of each x axis is 0.5 V, and one division of each Y axis is 50 μA.
Figure 17B:
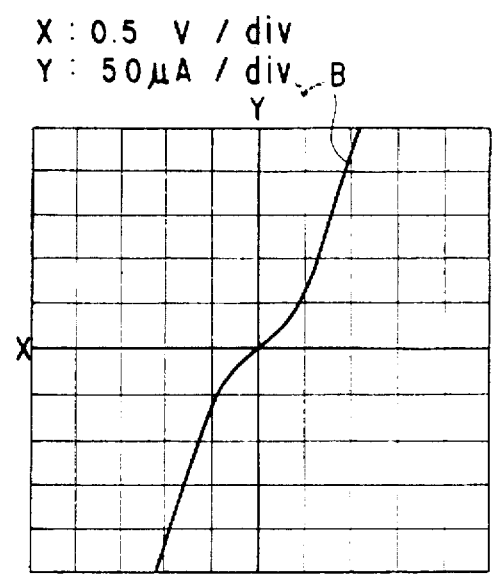
Figure 17C:
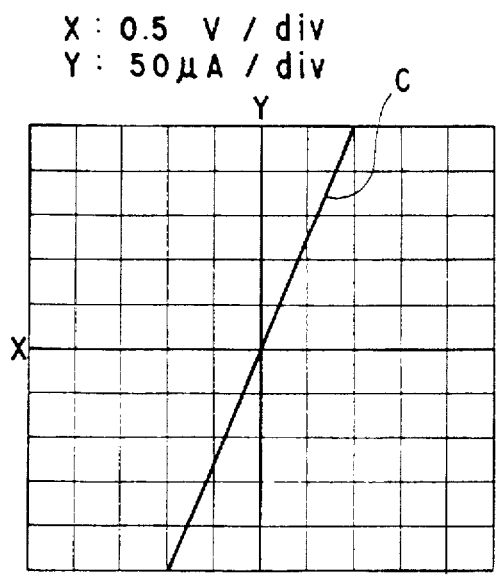
Figure 17D:
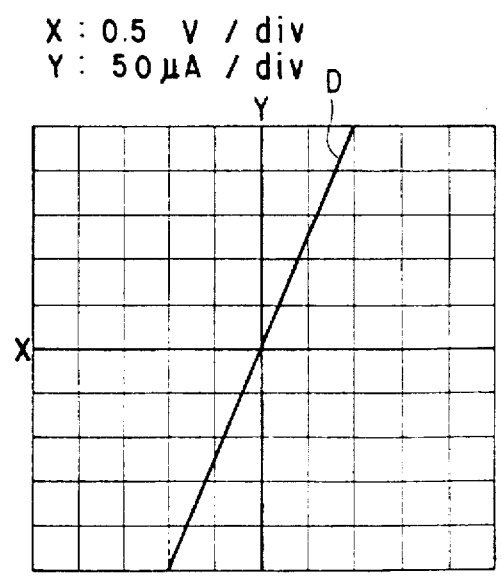

Experiments were conducted as in the same manner as in Experiment 8, except that a titanium layer having a thickness of 0.03 μm was vapor-deposited on the n-type GaN layer doped with silicon, and then an aluminum layer having a thickness of 0.1 μm was vapor-deposited, thus forming a first thin film, and further a titanium layer having a thickness of 0.03 μm was vapor-deposited on the aluminum layer, then a nickel layer having a thickness of 0.03 μm was vapor-deposited, and finally a gold layer having a thickness of 0.5 μm was vapor-deposited, thus forming a second film. The results are shown by lines A to D in FIGS. 17A to 17D, respectively. FIG. 17A relates to the annealing at 300° C., FIG. 17B relates to the annealing at 400° C., FIG. 17C relates to the annealing at 500° C., and FIG. 17D relates to the annealing at 600° C. As seen from these FIGURES, the electrode did not exhibit preferable ohmic characteristics with the n-type semiconductor layer, when annealed at 300° C. (FIG. 17A), but the electrodes exhibited preferable ohmic characteristics when annealed at 400° C. or more (FIG. 17B to FIG. 17D). It is also seen that the annealing at 600° C. did not degrade the ohmic characteristics of the electrode.

Experiment 12

In order to determine the bonding strength of an n-electrode with a gold ball, experiments were conducted in the same manner as in Experiment 10, using electrode materials shown in Table 3 below. The results are also shown in Table 3.

TABLE 3

| Material | Load | | | | | |
|---|---|---|---|---|---|---|
| | 20 g | 30 g | 40 g | 50 g | 60 g | 70 g |
| Ti—Al | 93 | 7 | — | — | — | — |
| Ti—Al—Au | 0 | 0 | 0 | 1 | 5 | crushed |
| Ti—Al—Ti—Au | 0 | 0 | 0 | 0 | 0 | crushed |
| Ti—Al—Ni—Au | 0 | 0 | 0 | 0 | 0 | crushed |
| Ti—Al—Ti—Ni—Au | 0 | 0 | 0 | 0 | 0 | crushed |

As seen from Table 3, the high-melting point metallic material improves the anti-oxidation property of the metallic material containing titanium and aluminum, and enhances the bonding strength with the gold ball.

It should be noted that the n-electrode of the present invention, as described so far, can be applied as the n-electrode 14 of any of the devices of FIG. 1, and FIGS. 3 to 9, thereby improving their device characteristics.

The present invention will be described below by way of the following Examples.

EXAMPLE 1

A wafer was prepared, which had a buffer layer (thickness: 0.02 μm) formed of an undoped GaN, an n-type GaN layer (thickness: 4 μm) doped with silicon, and a p-type GaN layer (thickness: 5 μm) doped with magnesium, sequentially stacked in the order mentioned on a sapphire substrate. Then, the p-type GaN layer was partially etched away to expose a portion of the surface of the n-type GaN layer.

The exposed surface portion of the n-type GaN layer was masked. Then, nickel and then gold were vapor-deposited on the entire surface of the p-type GaN layer, to a thickness of 0.03 μm, and a thickness of 0.07 μm, respectively. Then, the deposited film was masked, and aluminum was vapor-deposited on the exposed surface portion of the n-type GaN layer after removing the mask thereon.

Thereafter, the wafer thus obtained, was subjected to an annealing treatment at 500° C. for 10 minutes, thereby alloying the nickel and gold, and rendering them light-transmissive. The p-electrode after the annealing had a thickness of 0.07 μm, and was light-transmissive.

The wafer, thus annealed, was cut into chips of 350 μm square. One chip was mounted on a cup-like lead frame as shown in FIG. 1, and the predetermined wire bonding operation was performed, to prepare a light-emitting diode. The light-emitting output power of this diode was 80 μW at 20 mA, and the forward voltage was 4 V.

The number of chips cut out from the wafer was about 16,000. The yield of the good quality devices obtained from these chips, excluding the contact-failure devices was 95% or more.

Meanwhile, chips were cut out from the wafer obtained in Example 1 so that the chip might be mounted on two separate lead frames, with the n-electrode and p-electrode contacted with the corresponding lead frames, respectively. i.e., with the sapphire substrate directed upward in the finished device, as in the prior art. The chip size had to be as large as 1 mm square at the minimum. The chip obtained was seated astride the two separate lead frames, and the predetermined electrode connections were performed to obtain a light-emitting diode. The light-emitting output power of this device was 40 μW at 20 mA, indicating that the light in the lateral direction was not fully available. Further, the number of chips cut out from the wafer was only 2,000, and the yield of the good quality devices obtained from these chips, excluding the contact-failure devices, was only 60%.

Thus, it was confirmed that, according to the present invention, a light-emitting device can be provided, which allows the observation of the light emitted therefrom to be made at the side of the gallium nitride-based III–V Group compound semiconductor layers, because the p-electrode of the invention can establish an ohmic contact with the p-type semiconductor layer, and is light-transmissive, effectively conducting the emitted light outside, without reducing the external quantum efficiency of the device. Further, it was confirmed that, according to the present invention, the chip size can be reduced, thus greatly increasing the productivity of the device, the yield of the devices can be enhanced, and the production costs can be reduced.

EXAMPLE 2

The same procedures were followed as in Example 1, except that the annealing was performed at 600° C. The p-electrode obtained had a thickness substantially the same as that of Example 1, and was light-transmissive, similarly. Further, the light-emitting output power and the forward bias voltage of the light-emitting diode obtained were substantially the same as those of the diode of Example 1. The yield was also the same as in Example 1.

EXAMPLE 3

The same procedures were followed as in Example 1, except that a 0.5 μm thick chromium layer, and then a 0.5 μm thick nickel layer were vapor-deposited on the p-type GaN layer. The p-electrode obtained had a thickness of 0.7 μm, and similarly light-transmissive. Further, the light-emitting output power and the forward bias voltage of the light-emitting diode obtained were substantially the same as those of the diode of Example 1. The yield was also the same as in Example 1.

EXAMPLE 4

The same procedures were followed as in Example 1, except that a 0.01 μm thick platinum layer, and then a 0.1 μm thick titanium layer were vapor-deposited on the p-type GaN layer. The p-electrode obtained had a thickness of 0.07 μm, and similarly light-transmissive. Further, the light-emitting output power and the forward bias voltage of the light-emitting diode obtained were substantially the same as those of the diode of Example 1. The yield was also the same as in Example 1.

EXAMPLE 5

A wafer of a double heterostructure was prepared by sequentially growing, on a sapphire substrate having a diameter of 2 inches, a GaN buffer layer, an n-type GaN layer doped with silicon, a first clad layer of GaAlN doped with silicon, an active layer of InGaN doped with zinc and silicon, a second clad layer of GaAlN doped with magnesium, and finally a contact layer of p-type GaN doped with magnesium.

Then, an etching was performed such that one chip will have the structure of FIG. 10, thus partially exposing the n-type GaN layer. By using a predetermined mask, a 100 angstrom thick titanium layer and then a 0.5 μm thick gold layer were formed to form a multi-layered film having a diameter of 100 μm on each exposed portion of the n-type GaN layer.

The wafer, thus obtained, was subjected to an annealing treatment at 600° C. for 5 minutes under nitrogen atmosphere, thereby converting each multi-layered film into an n-electrode. The current-voltage characteristics of all n-electrode were measured with a wafer prober, and indicated the ohmic characteristics as shown in FIG. 12D.

Thereafter, a p-electrode was formed on the p-type contact layer by a conventional method, and the wafer was cut into respective chips. Thus, 15,000 chips were obtained from the 2-inch diameter wafer.

Each chip was mounted on a lead frame by the die bonding, and gold wires were bonded to the p- and n-electrodes, respectively, by the ball bonder. Of the 15,000 chips, no n-electrodes were separated from the balls during the ball bonding. Further, twenty chips were sampled at random, and the gold wire of each chip was pulled. All the gold wires were broken before peeling off the n-electrodes.

EXAMPLE 6

15,000 light-emitting chips were obtained in the same manner as in Example 5, except that a 100 angstrom titanium layer, and then a 0.4 μm thick aluminum layer were vapor-deposited as the n-electrode material. The measurement of the current-voltage characteristics on all the n-electrodes gave the characteristics shown in FIG. 11A. Of the 15,000 chips, no n-electrodes were separated from the balls during the ball bonding. Further, twenty chips were sampled at random, and the gold wire of each chip was pulled. All the gold wires were broken before peeling off the n-electrodes.

EXAMPLE 7

15,000 light-emitting chips were obtained in the same manner as in Example 5, except that a 0.5 μm thick layer of a Ti—Al alloy containing 1% by weight of titanium was vapor-deposited as the n-electrode material. The measurement of the current-voltage characteristics on all the n-electrodes with the wafer prober gave the characteristics shown in FIG. 11B. Of the 15,000 chips, no n-electrodes were separated from the balls during the ball bonding. Further, twenty chips were sampled at random, and the gold wire of each chip was pulled. All the gold wires were broken before peeling off the n-electrodes.

EXAMPLE 8

The light-emitting chip of Example 5 was mounted on two separate lead frames at its p-electrode and n-electrode. The p-electrode and n-electrode were adhered to the lead frames with indium adhesives, respectively. After the bonding, the lead frames were pulled. The indium adhesive and the lead frame were separated at the interface therebetween.

This Example demonstrates that the n-electrode of the invention strongly adheres to a lead frame with a conventional adhesive, such as solder, indium, a gold alloy.

EXAMPLE 9

15,000 light-emitting chips were obtained in the same manner as in Example 5, except that a 100 angstrom thick titanium layer, and then a 0.1 μm thick aluminum layer were vapor-deposited to form a first thin film, and further a 0.1 μm thick titanium layer and then a 0.1 μm thick nickel layer were vapor-deposited as the second thin film. The measurement of the current-voltage characteristics on all the n-electrodes with the wafer prober gave the characteristics shown in FIG. 13D. Of the 15,000 chips, no n-electrodes were separated from the balls during the ball bonding. Further, twenty chips were sampled at random, and the gold wire of each chip was pulled. All the gold wires were broken before peeling off the n-electrodes.

EXAMPLE 10

15,000 light-emitting chips were obtained in the same manner as in Example 9, except that a 0.1 μm thick titanium layer, and then a 0.4 μm thick gold layer were vapor-deposited as the second thin film of the n-electrode material. The measurement of the current-voltage characteristics on all the n-electrodes with the wafer prober gave the characteristics shown in FIG. 14D. Of the 15,000 chips, no n-electrodes were separated from the balls during the ball bonding. Further, twenty chips were sampled at random, and the gold wire of each chip was pulled. All the gold wires were broken before separating from the n-electrodes.

EXAMPLE 11

15,000 light-emitting chips were obtained in the same manner as in Example 9, except that a 0.1 μm thick titanium layer, then a 0.1 μm thick nickel layer, and finally a 0.4 μm thick gold layer were vapor-deposited as the second thin film of the n-electrode material. The measurement of the current-voltage characteristics on all the n-electrodes with the wafer prober gave the characteristics shown in FIG. 13C or 13D. Of the 15,000 chips, no n-electrodes were separated from the balls during the ball bonding. Further, twenty chips were sampled at random, and the gold wire of each chip was pulled. All the gold wires were broken before separating from the n-electrodes.

EXAMPLE 12

The light-emitting chip of Example 9 was mounted on two separate lead frames at its p-electrode and n-electrode. The p-electrode and n-electrode were adhered to the lead frames with indium adhesives, respectively. After the adhesion, the lead frames were pulled. The indium adhesive and the lead frame were separated at the interface therebetween.

The present invention has been described with reference to specific embodiments. However, the present invention should not be limited thereto, and each embodiment may be applied to the other embodiments where appropriate. Further, the present invention can also be applied to gallium nitride-based III–V Group compound semiconductor light-emitting device of a p-n single heterostructure, in addition to gallium nitride-based III–V Group compound semiconductor light-emitting device of a p-n homojunction structure, or of a double heterostructure. In addition, the present invention may be applied to not only a light-emitting diode, but also the other light-emitting device such as a light-emitting laser diode, as well as a photodetector having the sensitivity to a wavelength of 600 nm or less, such as a solar cell or a photodiode. Furthermore, the present invention provides an electrode material which forms an ohmic contact with a gallium nitride-based III–V Group compound semiconductor, and thus can be applied to any suitable device having a p-type gallium nitride-based III–V Group compound semiconductor layer and/or an n-type gallium nitride-based III–V Group compound semiconductor layer, on a substrate. As such a substrate, not only an insulating substrate such as sapphire, but also a semiconductor substrate such as silicon carbide (SiC), silicon (Si), zinc oxide (ZnO), gallium arsenide (GaAs) or gallium phosphide (GaP) may be used.

What is claimed is:

1. A gallium nitride-based III–V group compound semiconductor device, comprising:

a substrate having first and second major surfaces;

a semiconductor stacked structure arranged over said first major surface of the substrate, and comprising an n-type gallium nitride-based III–V group compound semiconductor layer, and a p-type gallium nitride-based III–V group, compound semiconductor layer said p-type semiconductor layer containing hydrogen;

a first electrode provided in electrical contact with said n-type semiconductor layer; and a second electrode provided over, and in electrical contact with said p-type semiconductor layer, and comprising a metallic material, said second electrode being light-transmissive, and establishing an ohmic contact with said p-type semiconductor layer by expelling of said hydrogen in said p-type semiconductor layer therethrough.

2. The device according to claim 1, wherein said second electrode covers substantially the entire surface of said p-type semiconductor layer.

3. The device according to claim 2, wherein said substrate is transparent.

4. The device according to claim 3, wherein said substrate comprises sapphire.

5. The device according to claim 1, wherein said second electrode comprises at least two metals selected from chromium, nickel, gold, titanium and platinum.

6. The device according to claim 5, wherein said second electrode comprises a first layer of one metal, and a second layer of another metal provided on said first layer.

7. A gallium nitride-based II–V Group compound semiconductor device, comprising a p-type gallium nitride based III–V Group compound semiconductor layer containing hydrogen, and an electrode provided over, and in electrical contact with said p-type semiconductor layer and comprising a metallic material, said electrode being light-transmissive, and establishing an ohmic contact with said p-type semiconductor layer therethrough, by expelling said hydrogen in said p-type semiconductor layer.

8. The device according to claim 7, wherein said electrode comprises at least two metals selected from chromium, nickel, gold, titanium and platinum.

9. The device according to claim 8, wherein said second electrode comprises a first layer of one metal, and a second layer of another metal provided on said first layer.

10. The device according to claim 1 comprising a bonding pad electrically connected to said second electrode, for bonding with a bonding wire.

11. The device according to claim 10, wherein said bonding pad comprises gold, or a metallic material comprising gold and not containing aluminum or chromium.

12. The device according to claim 10, wherein said bonding pad comprises a metallic material comprising gold and at least one metal selected from titanium, nickel, indium and platinum.

13. The device according to claim 10, wherein said bonding pad is formed of the same material forming said second electrode.

14. The device according to claim 10, wherein said bonding pad comprises a layer of nickel provided in direct contact with said second layer, and a layer of gold provided on said nickel layer.

15. The device according to claim 10, wherein said second electrode has a cut-off portion exposing a part of the surface of said p-type semiconductor layer, and said bonding pad is filled in said cut-off portion.

16. The device according to claim 15, wherein said bonding pad is formed of a metallic material which adheres to said p-type semiconductor layer more strongly than to said second electrode.

17. The device according to claim 16, wherein said bonding pad comprises aluminum, or a metallic material comprising at least two metals selected from chromium, aluminum and gold.

18. The device according to claim 10, wherein said bonding pad is arranged farthest from said first electrode.

19. A gallium nitride-based III-V Group compound semiconductor device, comprising:
  a substrate having first and second major surfaces;
  a semiconductor stacked structure arranged over said first major surface of the substrate, and comprising an n-type gallium nitride-based III-V Group compound semiconductor layer and a p-type gallium nitride-based III-V Group compound semiconductor layer;
  a first electrode provided in electrical contact with said n-type semiconductor layer;
  a second electrode provided in electrical contact with said p-type semiconductor layer, and comprising a metallic material, said second electrode being light-transmissive, and establishing an ohmic contact with said p-type semiconductor layer; and
  a transparent protective layer comprising an electrically insulative material and covering said second electrode.

20. The device according to claim 19, wherein said protective layer comprises silicon oxide, aluminum oxide, titanium oxide or silicon nitride.

21. The device according to claim 19, wherein said protective layer also covers a surface of said first electrode.

22. The device according to claim 19, wherein said second electrode covers substantially the entire surface of said p-type semiconductor layer.

23. The device according to claim 22, wherein said substrate is transparent.

24. The device according to claim 23, wherein said substrate comprises sapphire.

25. The device according to claim 19, wherein said second electrode comprises at least two metals selected from chromium, nickel, gold, titanium and platinum.

26. The device according to claim 25, wherein said second electrode comprises a first layer of one metal, and a second layer of another metal provided on said first layer.

27. The device according to claim 19, comprising a bonding pad electrically connected to said second electrode for bonding with a bonding wire.

28. The device according to claim 27, wherein said bonding pad comprises gold, or a metallic material comprising gold and not containing aluminum or chromium.

29. The device according to claim 27, wherein said bonding pad comprises a metallic material comprising gold and at least one metal selected from titanium, nickel, indium and platinum.

30. The device according to claim 27, wherein said bonding pad is formed of the same material forming said second electrode.

31. The device according to claim 27, wherein said bonding pad comprises a layer of nickel provided in direct contact with said second layer, and a layer of gold provided on said nickel layer.

32. The device according to claim 27, wherein said second electrode has a cut-off portion exposing a part of the surface of said p-type semiconductor layer, and said bonding pad is filled in said cut-off portion.

33. The device according to claim 32, wherein said bonding pad is formed of a metallic material which adheres to said p-type semiconductor layer more strongly than to said second electrode.

34. The device according to claim 33, wherein said bonding pad comprises aluminum, or a metallic material comprising at least two metals selected from chromium, aluminum and gold.

35. The device according to claim 27, wherein said bonding pad is arranged farthest from said first electrode.

36. The device according to claim 1, wherein said hydrogen is contained in said p-type semiconductor layer by preparing said p-type semiconductor layer by a chemical vapor deposition utilizing a reactant containing hydrogen.

37. The device according to claim 7, wherein said hydrogen is contained in said p-type semiconductor layer by preparing said p-type semiconductor layer by a vapor phase growth method utilizing a reactant containing hydrogen.

* * * * *